US006956516B2

(12) United States Patent
Furuichi

(10) Patent No.: US 6,956,516 B2
(45) Date of Patent: Oct. 18, 2005

(54) A/D CONVERSION CIRCUIT, TEMPERATURE-SENSOR CIRCUIT, INTEGRATED CIRCUIT, AND METHOD OF ADJUSTING THE TEMPERATURE-SENSOR CIRCUIT

(75) Inventor: Shuji Furuichi, Hachioji (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/793,646

(22) Filed: Mar. 4, 2004

(65) Prior Publication Data

US 2004/0227651 A1 Nov. 18, 2004

(30) Foreign Application Priority Data

Mar. 5, 2003 (JP) ....................................... 2003-058920

(51) Int. Cl.[7] ................................................ H03M 1/12
(52) U.S. Cl. ........................ 341/155; 341/118; 341/143
(58) Field of Search ................................ 341/144, 145, 341/155, 156, 118, 119, 126, 164, 165, 143, 120

(56) References Cited

U.S. PATENT DOCUMENTS 4,243,975 A * 1/1981 Masuda et al. ............. 341/168
5,727,023 A * 3/1998 Dent .......................... 375/244
5,907,299 A * 5/1999 Green et al. ................ 341/143
6,295,413 B1 * 9/2001 Ogasawara ................. 396/155

FOREIGN PATENT DOCUMENTS

JP 07-055857 3/1995

OTHER PUBLICATIONS

Patent Abstracts of Japan regarding Publication No. 07–055857 published Mar. 3, 1995.

* cited by examiner

*Primary Examiner*—John B. Nguyen
(74) *Attorney, Agent, or Firm*—Harness, Dickey & Pierce, P.L.C.

(57) ABSTRACT

An A/D-conversion circuit is provided that includes: a counter, which outputs a count value CT; a voltage generation circuit, which generates a monotonically increasing or monotonically decreasing analog voltage AV1; a comparator, which compares the analog voltage AV1 with an analog voltage AV2 to which A/D conversion is conducted, and outputs an signal CQ according to the comparison result; a digital filter circuit, which conducts digital filtering processing to the signal CQ and outputs a signal DQ; and a count value hold circuit EFF, which holds the count value CT from the counter based on the signal DQ. The digital filter includes hold circuits FF1 to FF3 and changes the voltage level of the signal DQ, when a pattern of the output signals Q1 to Q3 thereof matches a predetermined pattern.

10 Claims, 19 Drawing Sheets

| Environmental temperature | Digital value |
|---|---|
| To | DNo |
| ⋮ | ⋮ |

A/D CONVERSION CIRCUIT, TEMPERATURE-SENSOR CIRCUIT, INTEGRATED CIRCUIT, AND METHOD OF ADJUSTING THE TEMPERATURE-SENSOR CIRCUIT

RELATED APPLICATIONS

This application claims priority to Japanese Patent Application No. 2003-058920 filed Mar. 5, 2003 which is hereby expressly incorporated by reference herein.

BACKGROUND

1. Field of the Invention

The present invention relates to an A/D-conversion circuit, a temperature-sensor circuit, an integrated circuit, and a method of adjusting the temperature-sensor circuit.

2. Description of the Related Art

As for an A/D-conversion circuit, which converts an analog voltage into a digital value, various types such as an integration type and a successive approximation type have been used conventionally.

However, not much consideration has been given to noise generated in analog voltage for conventional A/D-conversion circuits.

Moreover, as for a display control circuit for a display unit using an electro-optical element, a control that takes into consideration temperature dependency characteristics of the electro-optical element is needed. Taking a liquid crystal as an example of an electro-optical element, transmissivity of a liquid crystal varies even when the same voltage is applied, as environmental temperature varies. Therefore, a display control circuit needs to apply a voltage corresponding to environmental temperature to a liquid crystal by conducting temperature compensation. For this reason, it is preferable to embed a temperature-sensor circuit in the display-control circuit. Thus, an A/D-conversion circuit for recognizing the environmental temperature is needed in such a temperature sensor circuit. However, it turned out that there have been cases that noise causes errors in the A/D conversion results in A/D-conversion circuits used for such a temperature sensor circuit.

The present invention has been made in view of the above technical problem, and an object thereof is to provide an A/D-conversion circuit, which does not easily malfunction even if noise is generated, a temperature-sensor circuit and an integrated circuit containing the same A/D-conversion circuit, and a method of adjusting the temperature-sensor circuit.

SUMMARY

The present invention relates to an A/D-conversion circuit, which converts an analog voltage to a digital value and outputs. The A/D-conversion circuit includes: a counter, which outputs a count value; a first voltage generation circuit, which generates a first analog voltage that monotonically increases or decreases; a comparator, which compares the first analog voltage from the first voltage generation circuit with a second analog voltage, to which A/D conversion is applied, and outputs an output signal according to a comparison result; a digital filter circuit, which executes digital filtering for the output signal from the comparator, and outputs the output signal, to which the digital filtering process has been conducted; and a count value hold circuit, which holds the count value from the counter based on the output signal from the digital filter circuit, and outputs the held count value as the digital value.

As for the present invention, the first voltage generation circuit generates the first analog voltage, which monotonically increases or decreases. In this case, the first voltage generation circuit may generate the first analog voltage based on the count value from the counter, or the first voltage generation circuit may start to monotonically increase or decrease the first analog voltage at the same time as a start of the count operation of the counter. Then, as for the present invention, the comparator conducts a comparison processing of the first analog voltage and the second analog voltage, and the digital filter circuit conducts digital filtering processing to an output signal of the comparator (for example, a digitized signal). Then, the count value hold circuit takes in and holds the count value from the counter based on the output signal after the digital filtering processing (a change of the output signal).

By doing this, the second analog voltage can be converted into a digital value. As for the present invention, a digital filter circuit is provided between the comparator and the count value hold circuit. Therefore, even if noise of a long-period is generated in the output signal of the comparator, the noise can be removed, thereby preventing malfunctions when the noise is generated. Because the digital filter circuit just needs to conduct digital filtering processing, for example, to the digitized signal from the comparator, the circuit scale of the digital filter circuit can be reduced. Therefore, even if noise is generated, an A/D-conversion circuit, which does not easily malfunction, can be realized with a small-scale circuit.

Moreover, as for the present invention, the digital filter includes a first to Nth (N is an integer of 2 or more) hold circuits, wherein an output signal from the comparator is held by the first hold circuit and the held signal is sequentially transferred by shifting to the hold circuits of the subsequent stage, and the voltage level of the output signal of the digital filter circuit may be changed when a pattern of the output signals of the first to Nth hold circuits matches a predetermined pattern.

As for the present invention, the output signal from the comparator is held at the first hold circuit. Then, the signal held at the first hold circuit is transferred by shifting to the second hold circuit. Then, the signal held at the second hold circuit is transferred by shifting to the third hold circuit. Thus, as for the present invention, the signal held at the hold circuit of the proceeding stage is sequentially transferred to the hold circuit of the subsequent stage. Then, if a pattern of the output signals of the first to Nth hold circuits matches with a predetermined pattern, the voltage level of the output signal of the digital filter circuit changes, and the count value at that time is held at the count value hold circuit. By doing this way, digital filtering processing can be conducted, for example, based on the signal held for a plurality of clock cycles.

Moreover, the digital filter circuit may change the voltage level of the output signal of the digital filter circuit after the voltage level of the output signal of the first hold circuit has changed.

For example, the voltage level of the output signal of the digital filter circuit is changed at a time when the voltage level of the output signal of the first hold circuit changes, or the voltage level of the output signal of the digital filter circuit is changed at a time when the voltage levels of the output signals of the first, second, third, fourth to Nth hold circuits change.

Moreover, as for the present invention, a compensation circuit, which conducts subtraction or addition compensation of a phase-delay value in the digital filter circuit to the count value held at the count value hold circuit, may be included.

By doing this, A/D-conversion results with few conversion errors can be obtained.

As for the present invention, the first voltage generation circuit may be a D/A-conversion circuit, which generates a first analog voltage by converting the count value from the counter into an analog voltage.

However, the configuration of the first voltage generation circuit is not limited to this case. For example, the first analog voltage, which monotonically increases or decreases, may be generated by charging or discharging a capacitor with a current from a constant current source.

As for the present invention, the D/A-conversion circuit may generate the first analog voltage by voltage-dividing of a reference voltage, which has a temperature gradient characteristic different from the second analog voltage, based on the count value from the counter.

By doing this, for example, an A/D-conversion circuit, which is most suitable for a temperature-sensor circuit and the like can be realized.

Moreover, the present invention relates to a temperature-sensor circuit which includes: any of above-described A/D-conversion circuits; a reference-voltage generation circuit, which generates a reference voltage having a first temperature gradient characteristics, and supplies the generated reference voltage to the first voltage generation circuit as a reference voltage for generating the first analog voltage; and a second voltage generation circuit, which generates the second analog voltage having a second temperature gradient characteristics.

As for the present invention, the first voltage generation circuit generates the first analog voltage based on a reference voltage supplied from the reference-voltage generation circuit. Then, in this case, the first analog voltage has the same temperature gradient characteristics as the first temperature gradient characteristics, which the reference voltage has. Then, as for the present invention, the second voltage generation circuit generates the second analog voltage, which has the second temperature gradient characteristics different from the first temperature gradient characteristics. Then, the A/D-conversion circuit outputs a digital value according to the second analog voltage by comparing the first analog voltage, which has the same temperature gradient characteristics as the first temperature gradient characteristics (for example, substantially flat temperature gradient characteristics) and monotonically increases or decreases, with the second analog voltage, which has the second temperature gradient characteristics. Accordingly, the digital value to be outputted vary according to environmental temperature, and thus the temperature-sensor circuit can be realized.

Moreover, as for the present invention, the second voltage generation circuit may include: an adjustment circuit, which generates a first division voltage, which is a voltage-divided reference voltage from the reference-voltage generation circuit; a current generation circuit, which has a transistor, to which gate terminal the first division voltage is supplied, and generates a current according to the gate voltage of the transistor; and a current/voltage conversion circuit, which has a diode element, to which a current from the current generation circuit is supplied, and outputs an analog voltage, which is generated at both terminals of the diode element, as the second analog voltage.

As for the present invention, in the adjustment circuit, a current, which flows into the diode element, can be controlled by adjusting the first division voltage so as to generate an analog voltage corresponding to the environmental temperature at the time of the adjustment. After this adjustment, associating the obtained analog voltage with the environmental temperature becomes possible. Therefore, an environmental temperature with high precision can be determined with simple control. In particular, by obtaining the digital value with an A/D-conversion circuit, a temperature-compensation control can be conducted relatively independent of the accuracy of the A/D-conversion circuit.

Moreover, the present invention relates to an integrated circuit, which includes a power supply circuit, a first terminal that outputs the digital value from the A/D-conversion circuit, a second terminal into which a set value determined based on the digital value from the first terminal is inputted, and an electronic volume, which adjusts the output voltage of the power supply circuit based on the set value from the second terminal.

According to the present invention, even when the load characteristic of the power supply circuit, to which the adjustment is conducted, significantly varies due to the difference of manufacturers, material and the like, a flexible and highly precise temperature compensation can be realized.

Moreover, the present invention is a method for adjusting the above-described temperature-sensor circuit, and relates to the method of adjusting the temperature-sensor circuit, which determines a target value corresponding to a taken-in environmental temperature, and adjusts the first division voltage such that the digital value from the A/D-conversion circuit matches with the target value.

The taken-in environmental temperature includes the case that the measurement result of an environmental temperature at the time of adjusting the temperature-sensor circuit is inputted. Moreover, the target value corresponding to the environmental temperature can be obtained by using, for example, a table that stores the target values and looking up the table.

DETAILED DESCRIPTION

Hereinafter, embodiments of the present invention will be described. The embodiments to be described hereinafter do not limit the contents of the present invention described in the claims. Moreover, not all of the configurations to be described hereinafter are necessarily indispensable requirements of the configuration of the present invention.

A/D-Conversion Circuit

Figure 1:
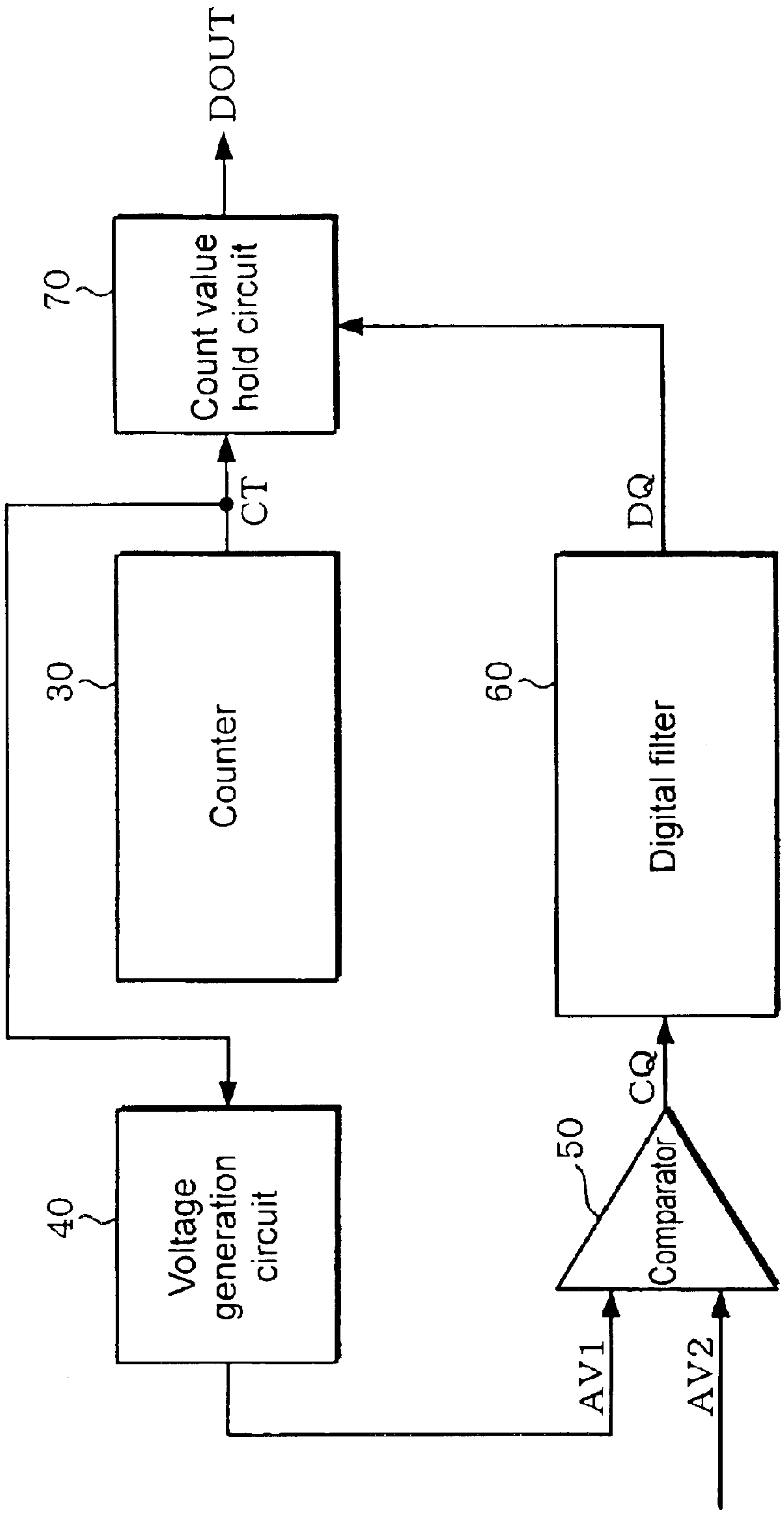
FIG. 1 is an example of a configuration of an A/D-conversion circuit.

FIG. 1 shows an example of a configuration of an A/D-conversion circuit (A/D converter) according to an embodiment of the present invention. In addition, as for the A/D-conversion circuit according to the embodiment, configurations omitting a part of the components in FIG. 1 may be employed.

The A/D-conversion circuit includes a counter 30. The counter 30 conducts a process of decrementing or incrementing a count value CT. The counter 30 can be constituted by a plurality of flip-flops (a shift register), which are cascaded-coupled, and a combination logic circuit, which outputs the count value CT based on the output signals of the flip-flops.

The A/D-conversion circuit includes a voltage generation circuit 40 (a first voltage generation circuit). The voltage generation circuit 40 generates an analog voltage AV1 (the first analog voltage) that monotonically increases or decreases (including a case where it monotonically increases or decreases in incremental steps). More specifically, for example, when the counter 30 is a down-counter (decrement type), the voltage generation circuit 40 receives the count value CT, which is sequentially decremented, synchronizing with a clock that is inputted into the counter 30. Then, the voltage generation circuit 40 outputs the analog voltage AV1 (AV1 which monotonically decreases as time passes) that monotonically decreases as the count value CT is decremented. When the counter 30 is an up-counter (increment type), the voltage generation circuit 40 receives the count value CT, which is sequentially incremented, synchronizing with a clock. Then, the voltage generation circuit 40 outputs the analog voltage AV1 (AV1 that monotonically increases as time passes) that monotonically increases, as the count value CT is incremented. The voltage generation circuit 40 may be a configuration that generates the analog voltage AV1, which monotonically increases or decreases, without using the count value CT.

The A/D-conversion circuit includes a comparator 50. The comparator 50 compares the analog voltage AV1 (the first analog voltage) from the voltage generation circuit 40, with an analog voltage AV2 (a second analog voltage), to which A/D conversion is applied, and outputs an output signal CQ corresponding to a comparison result. More specifically, when the analog voltages AV1 and AV2 become equal, the comparator 50 changes the output signal CQ from a first voltage level (for example, "L" level) to a second voltage level (for example, "H" level). For example, when the AV1 is a voltage, which monotonically decreases, the comparator 50 outputs the signal CQ of the first voltage level at the time of AV1>AV2, and outputs the signal CQ of the second voltage level when $AV1 \leqq AV2$ is attained. On the other hand, when the AV1 is a voltage, which monotonically increases, the comparator 50 outputs the signal CQ of the first voltage level at the time of AV1<AV2, and outputs the signal CQ of the second voltage level when $AV1 \geqq AV2$ is attained.

The A/D-conversion circuit includes a digital filter circuit 60 (digital filter). The digital filter circuit 60 conducts a digital filtering processing (a process to remove noise in the signal CQ, and a process to remove noise of one, or two or more clock cycle periods) to the output signal CQ of the comparator, and outputs a signal DQ, to which the digital filtering processing has been conducted.

More specifically, the digital filter circuit 60 receives the signal CQ that has been digitized by the comparator 50. Then, while holding the signal CQ for a plurality of clock cycle periods (for example, 2, or 3 or more clock cycle periods), a digital filtering processing (digital filtering processing to the digitized signal) is conducted to the held signal. Moreover, the digital filter circuit 60 also has a function of detecting an edge, which is a transition point of the voltage level of the signal CQ. That is, when a change (edge) of the voltage level of the signal CQ is noise (noise of a period shorter than a plurality of clock cycle periods), the digital filter circuit 60 does not output the change (edge) of the voltage level of the signal CQ as the signal DQ. On the other hand, when a change (edge) of the voltage level of the signal CQ is not noise, the digital filter circuit 60 outputs the change (edge) of the voltage level of the signal CQ as the signal DQ.

More specifically, cascaded-coupled first to Nth hold circuits (N is an integer of two or more) can be included in the digital filter circuit 60. The first hold circuit samples and holds the signal CQ based on a given clock (for example, a clock which operates the counter 30). Then, the second hold circuit holds the signal, which has been held at the first hold circuit (a flip-flop, latch and the like) in the preceding clock cycle, in the subsequent clock cycle. Thus, the signal held at the first hold circuit is transferred by shifting to the second hold circuit. Then, the third hold circuit holds the signal, which has been held at the second hold circuit in the preceding clock cycle, in the following clock cycle. Thus, the signal held at the second hold circuit is transferred by shifting to the third hold circuit. Then, in the digital filter circuit 60, digital filtering processing is conducted based on the signal (signal held for a plurality of clock cycle periods), which have been held at the first to Nth hold circuits in this way, and the signal DQ, to which digital filtering processing is conducted, is outputted. More specifically, whether a pattern of the signals (first to Nth signals) held at the first to Nth hold circuits matches with a predetermined pattern, prepared in advance, is judged, and if matched, the voltage level of the signal DQ is changed. In this case, the voltage level of the signal DQ changes with a delay of a predetermined clock cycle period (phase-delay value) after the timing that the voltage level of the signal CQ changes. A part of functions included in the digital filter circuit 60 may be realized by software.

The A/D-conversion circuit includes a count value hold circuit 70. The count value hold circuit 70 holds the count value CT from the counter 30 based on the output signal from the digital filter circuit 60. More specifically, the count value CT from the counter 30 is held at the timing when the voltage level of the output signal from the digital filter circuit 60 changes. Then, the held count value CT is outputted as a digital value DOUT (M-bit digital data wherein M is an integer of 2 or more). The count value CT held at the count value hold circuit 70, to which a predetermined digital processing (for example, compensation processing for phase-delay value, to be described hereinafter) has been applied, may be outputted as the digital value DOUT.

According to the A/D-conversion circuit according to the embodiment shown in FIG. 1, the signal CQ digitized by the comparator 50, to which digital signal processing is conducted, is outputted as the DQ to the count value hold circuit 70. Accordingly, even if noise is generated by noise and the like in the analog voltages AV1 and AV2, the digital filter circuit 60 removes the noise. Therefore, false values can be prevented from being held at the count value hold circuit 70, thereby ensuring normal conversion operation by the A/D-conversion circuit.

Such a filtering processing can also be realized by providing a digital filter circuit, which conducts digital filtering processing to a plurality of bits of digital data, in the subsequent stage of the count value hold circuit 70. However, as for this method, it is necessary to provide a large-scale digital filter circuit in the subsequent stage of the count value hold circuit 70, thereby causing an increase of scale of the A/D-conversion circuit.

On the other hand, the digital filter circuit 60 according to the embodiment is provided between the comparator 50 and the count value hold circuit 70, and needs to be just able to conduct the digital filtering processing to the CQ digitized by the comparator 50. Therefore, because the digital filter circuit 60 can be realized with a small-scale circuit configuration, there is an advantage that enables attaining decreased scale of the A/D-conversion circuit and reduced cost.

DETAILED EXAMPLES

Figure 2:
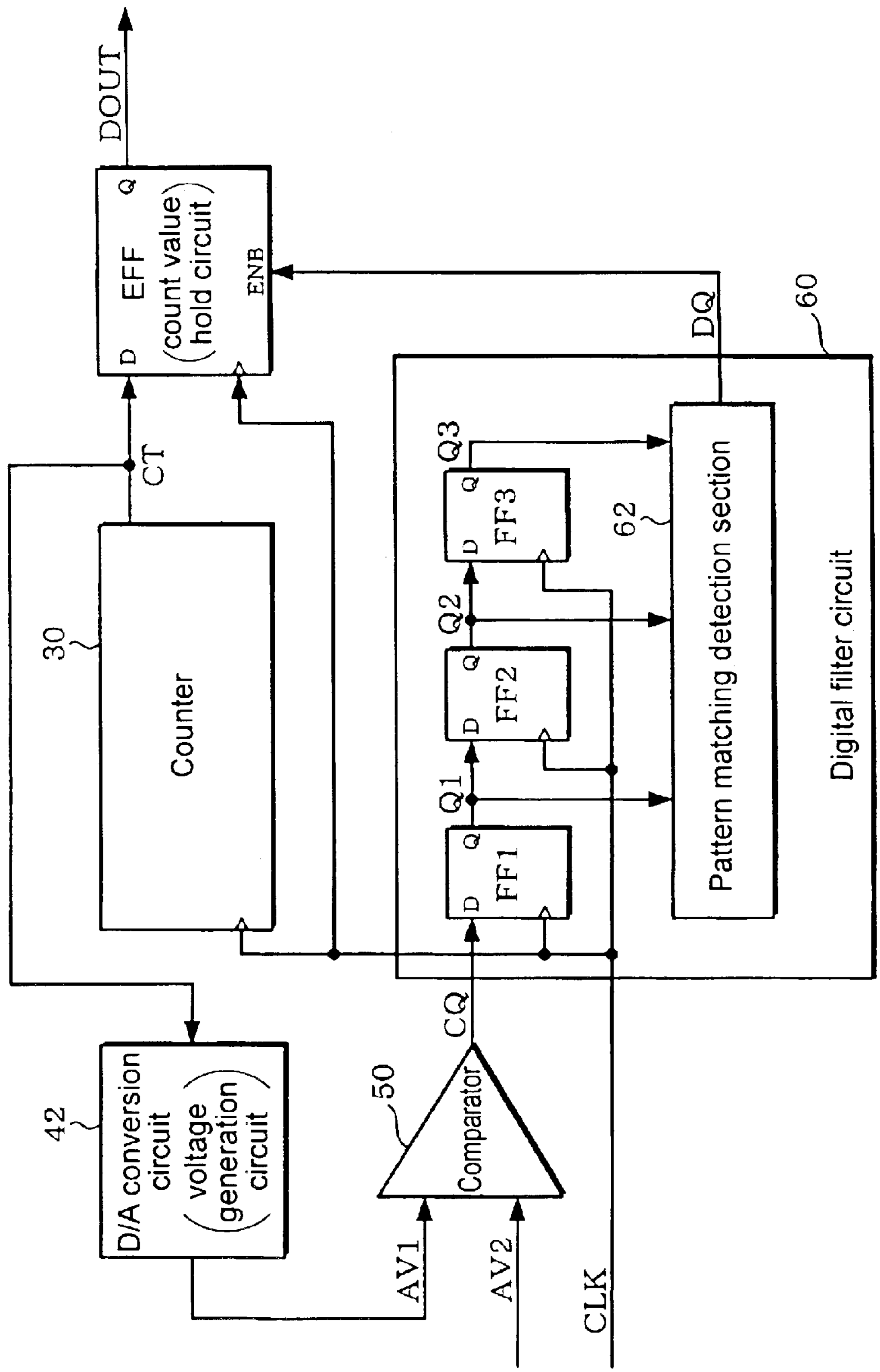
FIG. 2 is an example of a configuration of an A/D-conversion circuit in detail.

FIG. 2 shows a detailed example of the A/D-conversion circuit (A/D converter) according to the embodiment. As for the A/D-conversion circuit according to the embodiment, configurations omitting a part of the components in FIG. 2 may be employed The counter 30 conducts decrement or increment processing of the count value CT based on the clock CLK (decrement or increment processing is conducted synchronizing with the CLK).

A D/A-conversion circuit 42 is one embodiment of the voltage generation circuit 40 in FIG. 1. The D/A-conversion circuit 42 receives the count value CT from the counter 30, and generates the analog voltage AV1 by converting CT into an analog voltage. More specifically, the D/A-conversion circuit 42 generates the voltage AV1 by voltage-dividing of a reference voltage (for example, a reference voltage, which has a different temperature gradient characteristics from the AV2) based on the count value CT from the counter 30. That is, the division terminal is selected based on the count value CT, and a voltage generated at the selected division terminal is outputted as the AV1. However, the D/A-conversion circuit 42 is not limited to such a configuration.

The digital filter circuit 60 includes cascaded-coupled flip-flops FF1, FF2, and FF3 (first to Nth hold circuits in the broader sense, wherein N is an integer of 2 or more). FF1 (first hold circuit) holds the signal CQ from the comparator 50 based on the clock CLK (CQ is held synchronizing with CLK). Then, the signal held at FF1 is transferred by shifting to the subsequent stage FF2 (the second hold circuit) and held there. Thus, FF1 to FF3 function as a so-called shift register. In FIG. 2, although the number of flip-flop's (hold circuits in the broader sense) is three; two or 4 or more pieces may also be selected.

The digital filter circuit 60 includes a pattern matching detection section 62. The pattern matching detection section 62 judges whether a pattern of the output signals Q1 to Q3 (first to Nth output signals) of FF1 to FF3 matches with a predetermined pattern or not. If matched, the voltage level of the output signal DQ in the digital filter circuit 60 is changed.

A flip-flop EFF with an enable terminal is one embodiment of the count value hold circuit 70 in FIG. 1. The output signal DQ of the digital filter circuit 60 is inputted into an enable terminal ENB of the Flip-flop EFF. When the voltage level of the signal DQ changes and the enable terminal becomes active, the Flip-flop EFF takes in and holds the count value CT at that time based on the clock CLK. Then, the Flip-flop EFF outputs the held count value as the digital value DOUT.

Figure 3A:
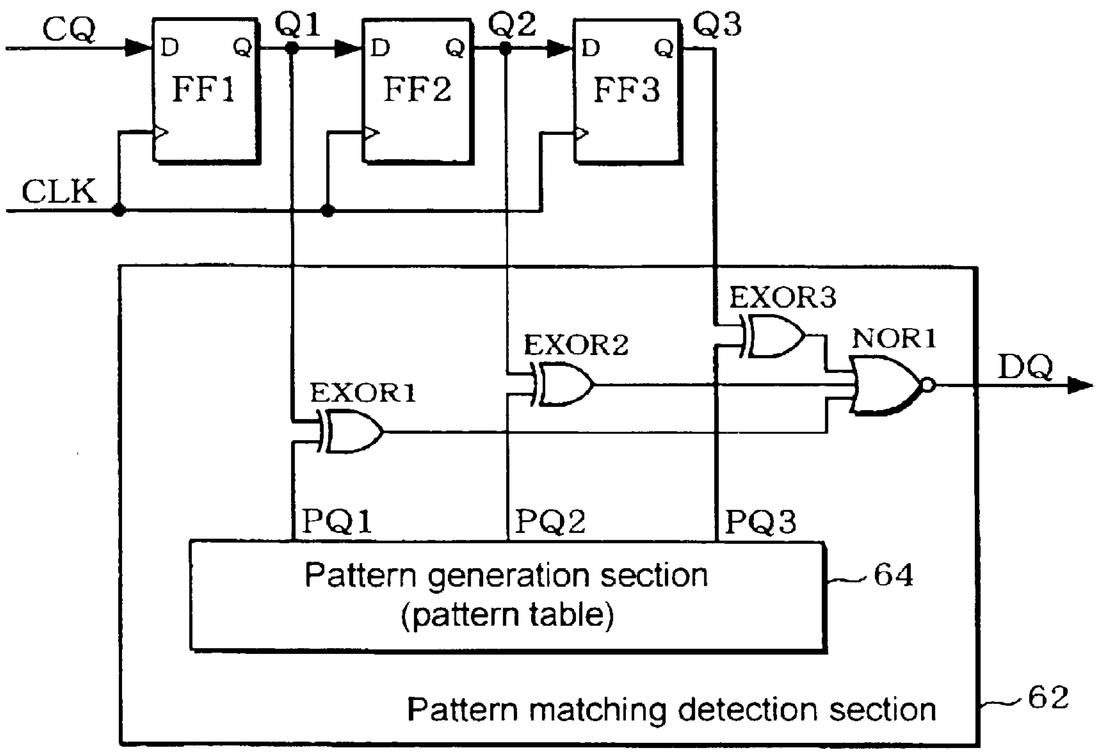
FIGS. 3(A) and (B) are examples of a configuration a pattern matching detection section.

FIG. 3(A) shows an example of a configuration of the pattern matching detection section 62, included in the digital filter circuit 60. The pattern matching detection section 62 in FIG. 3(A) includes a logic circuit, which has exclusive OR gates EXOR1 to EXOR3 (first to Nth exclusive OR gates in the broader sense) and a NOR-gate NOR1. The pattern matching detection section 62 also includes a pattern generation section 64 (a pattern table) that generates pattern signals PQ1 to PQ3 (first to Nth pattern signals in the broader sense). Then, each of the output signals Q1, Q2, and Q3 from FF1, FF2, and FF3 is inputted into one input of each of the EXOR1, EXOR2, and EXOR3, and each of the pattern signals PQ1, PQ2, and PQ3 from the pattern generation section 64 is inputted into the other input of each of the EXOR1, EXOR2, and EXOR3. Then, the outputs of the EXOR1 to EXOR3 are inputted into the NOR1, and the NOR1 outputs the signal DQ.

In the pattern matching detection section 62 in FIG. 3(A), when a pattern of the output signals Q1 to Q3 from FF1 to FF3 matches with the pattern signals PQ1 to PQ3 from the pattern generation section 64, the voltage level of the signal DQ changes.

According to the configuration of FIG. 3(A), because the pattern generation section 64 can output arbitrary pattern signals PQ1 to PQ3, there is an advantage that digital filtering processing of the digital filter circuit 60 can be freely programmed. This programming can be realized by setting up a preferred pattern value in the register, included in the pattern generation section 64, by a CPU (a processor, in the broader sense).

The logic circuit, comprised with EXOR1 to EXOR3 and NOR1, may be a circuit, which can just detect, at least, a matching between a pattern of the output signals Q1 to Q3 and the pattern signals PQ1 to PQ3, therefore various modifications can be made.

Figure 3B:
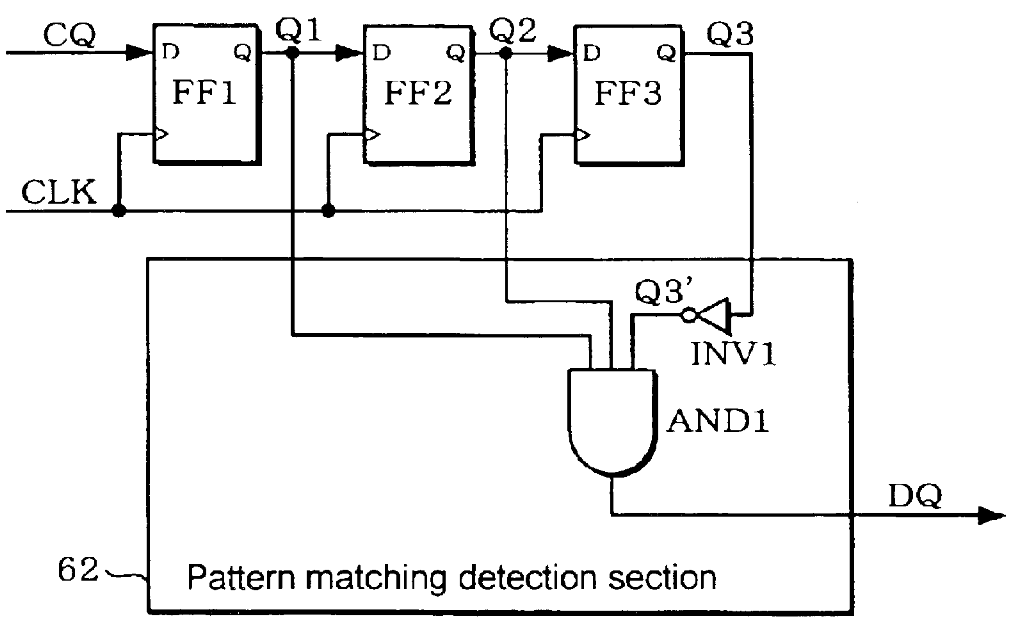

FIG. 3(B) shows another example of the pattern matching detection section 62. The pattern matching detection section 62 in FIG. 3(B) includes a logic circuit, which has an AND-gate AND1 and an inverter circuit INV1. The output signals Q1 and Q2 from the flip-flops FF1 and FF2, and a signal Q3', an inverted signal of the output signal Q3 of FF3, inverted by the INV1, are inputted into the AND1. Then, the AND1 outputs the signal DQ.

With regard to the configuration in FIG. 3(B), there is an advantage that the pattern matching detection section 62 can be realized by smaller numbers of gates as compared with FIG. 3(A). The logic circuit, which outputs the signal DQ upon receipt of the output signals Q1 to Q3 (first to Nth output signals) of the FF1 to FF3 (first to Nth hold circuits), is not limited to the logic circuit including the INV1 and the AND1 shown in FIG. 3(B), but may be a logic circuit, which can detect, at least, whether a pattern of the output signals Q1 to Q3 matches with a given signal pattern. For example, the INV1 may be coupled to other output signals Q1 and Q2. Alternately, instead of the AND1, logic gates (NAND gate, OR gate, or NOR gate) different from AND gate can also be used.

Operation

Figure 4:
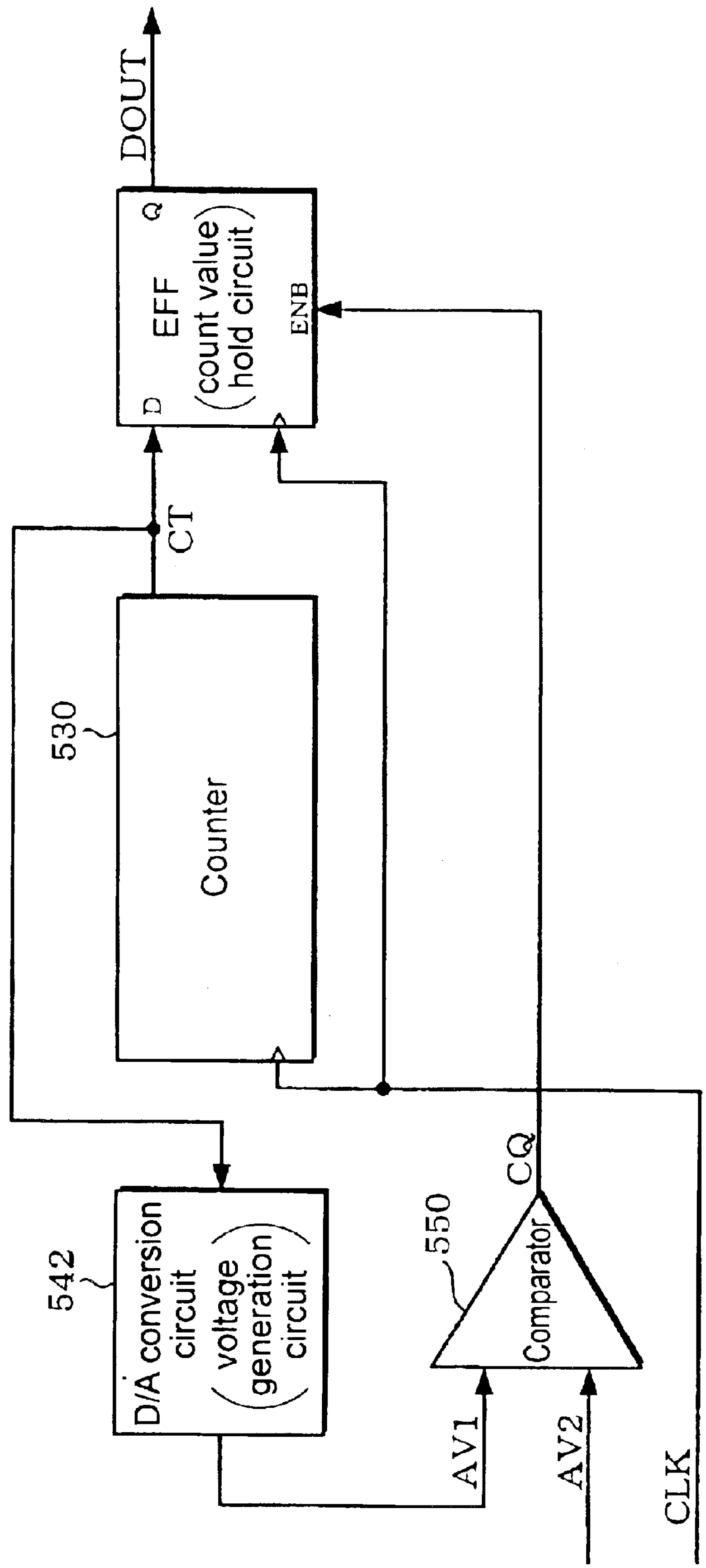
FIG. 4 is a comparison example with the embodiment of the present invention.

Next, the details of operation of the A/D-conversion circuit in FIG. 2 will be described. For example, an A/D-conversion circuit as a comparison example of the embodiment is shown in FIG. 4. Unlike the embodiment, in the A/D-conversion circuit of FIG. 4, a digital filter circuit is not provided between the comparator 550 and the Flip-flop EFF. The output signal CQ of the comparator 550 is directly inputted into a Flip-flop EFF.

Figure 5A:
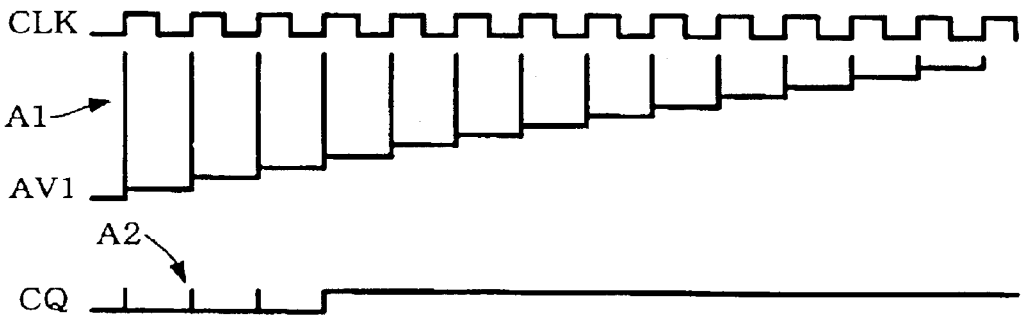
FIGS. 5(A) and (B) are examples of signal waveforms describing the operation according to the embodiment.

FIG. 5(A) shows an example of a signal waveform describing operation of the comparison example of FIG. 4. In the comparison example of FIG. 4, when noise (glitch) is generated in the analog voltage AV1 (or in the AV2) as shown in A1 of FIG. 5(A), noise is also generated in the output signal CQ of the comparator 550 as shown in A2. Due to the noise generated in the signal CQ, there is a possibility that the Flip-flop EFF may hold a false count value, thereby outputting false conversion results. In this case, if a configuration, in which one stage of flip-flop that holds the signal CQ is provided between the comparator 550 and the Flip-flop EFF, is adopted, noise of a short period (high frequency noise) such as glitches can be removed. However, even if adopting such a configuration, noise, which extends to a plurality of clock cycle periods, cannot be removed.

FIG. 5 (B) shows an example of a signal waveform describing the operation of the A/D-conversion circuit according to the embodiment. FIG. 5 (B) is an example of a signal waveform in the case of adopting the configuration of FIG. 3(B) as a configuration for the pattern matching detection section 62 of FIG. 2.

Figure 5B:
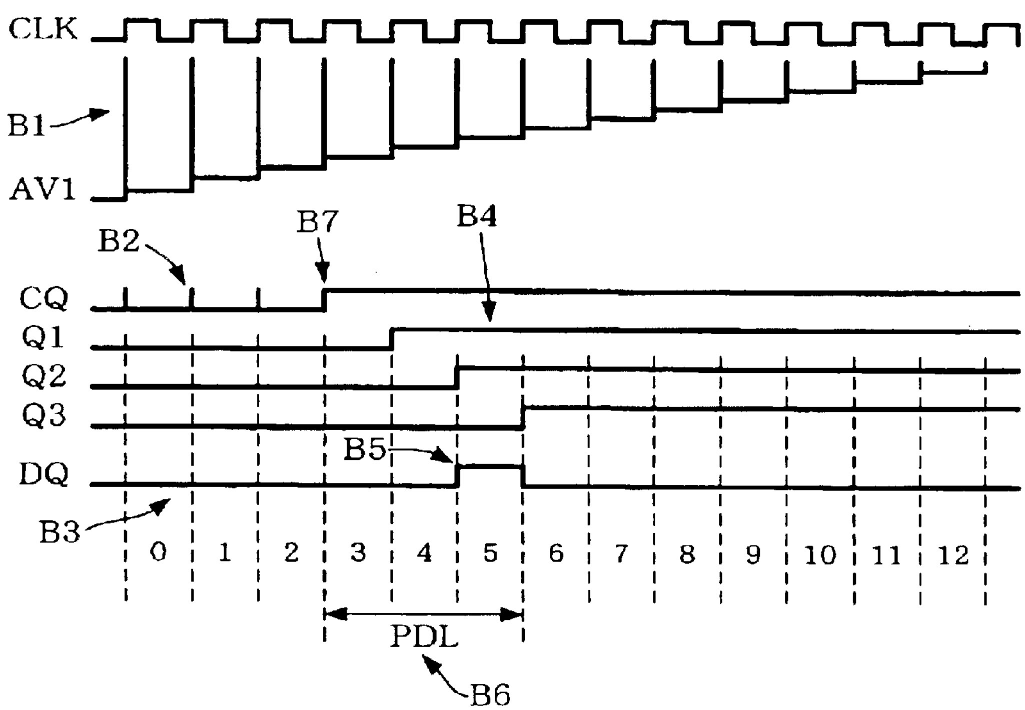

According to the embodiment, even if noise is generated in the analog voltage AV1 as shown in FIG. 5(B), and noise is also generated in signal the CQ as shown in B2, the noise is removed by the digital filter circuit 60. Therefore, as shown in B3, noise is not generated in the signal DQ, thereby malfunctioning can be prevented. Then, when a pattern of the output signals Q1, Q2, and Q3 of FF1, FF2, and FF3 matches with a pattern (1, 1, 0) as shown in B4 of FIG. 5(B), the voltage level of the signal DQ changes (a pulse of one clock cycle is generated) as shown in B5. In other words, the output signal DQ changes after the voltage level of the output signal Q1 of the flip-flop FF1 (first hold circuit) has changed (after having become active). Then, upon a change of the voltage level of the signal DQ (becoming active) as shown in B5, the count value CT at that time is taken into the Flip-flop EFF and held therein. Therefore, according to the embodiment, even if noise is generated as shown as B2, the Flip-flop EFF can be prevented from taking in a false count value.

Figure 6A:
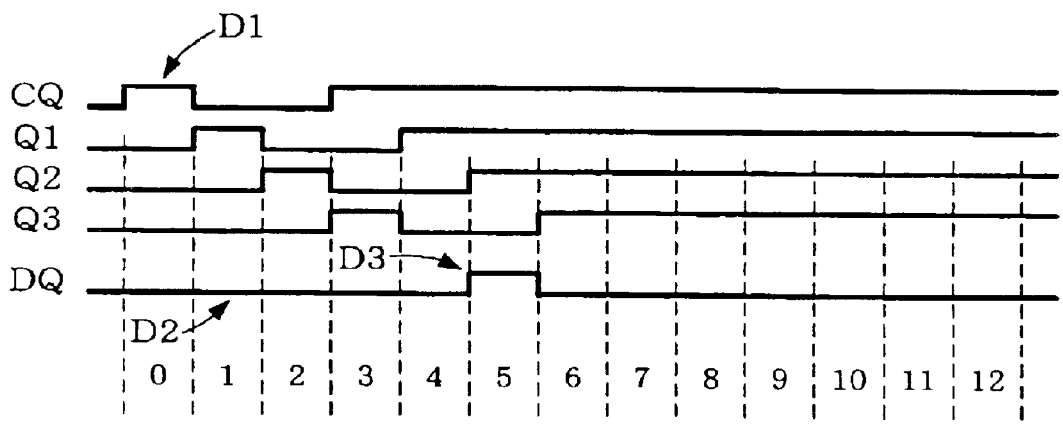
FIGS. 6(A) and (B) are examples of signal waveforms describing the operation according to the embodiment.
Figure 6B:
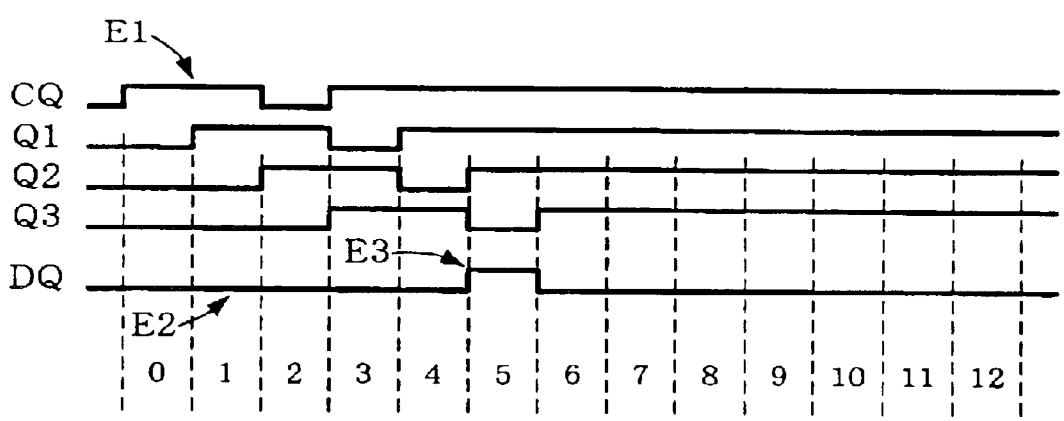

Moreover, according to the embodiment, even if noise, which remains over one clock cycle period, is generated in the signal CQ as shown in D1 of FIG. 6(A), the noise is not transmitted to the signal DQ as shown in D2. Then, as shown in D3, the signal DQ becomes active at the normal timing. Moreover, even if noise, which remains over two clock cycle periods, is generated in the signal CQ as shown in E1 of FIG. 6(B), the noise is not transmitted to the signal DQ as shown in E2. Then, as shown in E3, the signal DQ becomes active at the normal timing. Because the digital filter circuit 60 according to the embodiment removes the noise, which remains over a plurality of clock cycle periods, the noise resistance can be remarkably improved as compared with the comparison example of FIG. 4. Moreover, because the signal, to which digital filtering processing is conducted, is the digitized signal from the comparator CQ, there is an advantage that reduction of the scale of the digital filter circuit 60 can be made as shown in FIG. 3(A) and (B).

In FIG. 5(B), when a pattern of the output signals Q1, Q2, and Q3 matches with a pattern (1, 1, 0), the voltage level of the signal DQ is changed. However, the voltage level of the signal DQ may be changed, when a pattern of the output signals Q1, Q2, and Q3 matches with, for example, (1, 0, 0) or (1, 1, 1). Patterns, which are compared with the output signals Q1, Q2, and Q3 are arbitrary. In other words, the digital filter circuit 60 according to the embodiment may change the voltage level of the signal DQ, after the output signal Q1 of the flip-flop FF1 (first hold circuit) has changed or the voltage level of the output signals Q2 and Q3 of the FF2 and FF3 (the second and third hold circuit) have changed.

Compensation for Phase-Delay Value

Figure 7:
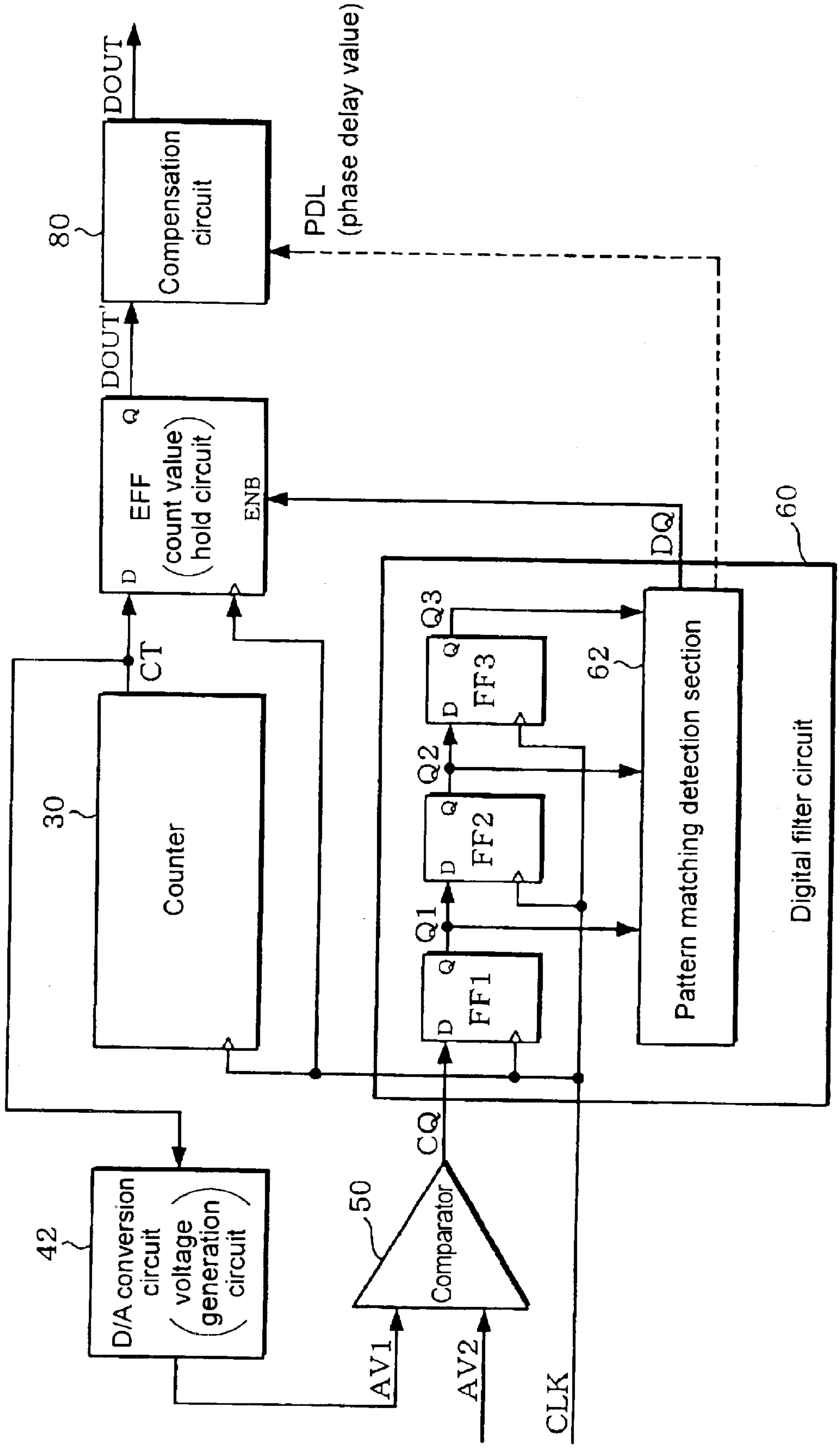
FIG. 7 is an example of a configuration of an A/D-conversion circuit provided with a compensation circuit.

FIG. 7 shows a modification of the A/D-conversion circuit according to the embodiment. In FIG. 7, a compensation circuit 80 is provided in the subsequent stage of a Flip-flop EFF. The compensation circuit 80 conducts addition or subtraction compensation for a phase-delay value PDL in the digital filter circuit 60 (delay value caused by shift processing of the first to Nth hold circuits) to the count value held at the Flip-flop EFF (count value hold circuit). Then, the result is outputted as the digital value DOUT. That is, the compensation circuit 80 is used for compensating the phase delay generated in the digital filter circuit 60, and for eliminating the conversion error due to the phase delay.

The phase-delay value PDL is a value shown in B6 of FIG. 5 (B), and the phase delay of three clock cycles is generated in B6. In such a case, the compensation circuit 80 subtracts PDL=3 from the digital value DOUT' of the Flip-flop EFF. That is, in order to obtain an A/D-conversion result without any conversion error, it is necessary to take in the count value CT to the Flip-flop EFF at the timing shown in B7 of FIG. 5(B). However, in the embodiment, because the digital filter circuit 60 is provided, the voltage level of the signal DQ changes with a delay of a predetermined time after the voltage level of the signal CQ has changed. Therefore, if the count value CT is taken in to the Flip-flop EFF at the timing of B5 of FIG. 5(B), a conversion error arises in the A/D conversion. That is, there is a shift of the phase-delay value PDL from the correct value. Therefore, according to the embodiment, the generation of the conversion error is prevented by providing the compensation circuit 80 of FIG. 7.

When changing the voltage level of the signal DQ, for example, at the timing when a pattern of the output signals Q1, Q2, and Q3 matches with (1, 0, 0), the phase-delay value PDL becomes “2”. On the other hand, when changing the voltage level of the signal DQ, for example, at the timing when a pattern of the output signals Q1, Q2, and Q3 matches with (1, 1, 1), the phase-delay value PDL becomes "4". Thus, the phase-delay value PDL changes according to a pattern, which becomes a comparison target of the output signals Q1, Q2, and Q3. In other words, the phase-delay value PDL is determined by the length of the period until the voltage level of the signal DQ changes, after the voltage level of the signal CQ changes.

Moreover, in FIG. 5(B), because the analog voltage AV1 is a monotonically increasing voltage, the compensation circuit 80 subtracts the phase-delay value PDL from the digital value DOUT' of the Flip-flop EFF. However, if the AV1 is a monotonically decreasing voltage, the compensation circuit 80 may add the phase-delay value PDL to the digital value DOUT'.

According to the above-described embodiment, the correct A/D-conversion result can be obtained just by providing the compensation circuit 80, which conducts subtraction or addition processing of the phase-delay value PDL. Because a circuit with a lot of gates such as registers, which hold data, does not need to be provided, correct A/D-conversion results can be obtained by a small scale A/D-conversion circuit. Moreover, A/D-conversion results that contain few errors can also be obtained by compensating the analog voltages AV1 and AV2. Even in such a case, an advantage of the maximally increased resolution of the A/D conversion can be obtained by providing the compensation circuit 80.

Moreover, in the embodiment, attention has been paid to the fact that the group delay in the digital filter circuit 60 is constant, even if the frequency characteristic of the analog voltage AV2 changes. That is, because the group delay becomes constant in the digital filter circuit 60, the phase-delay value PDL, to which subtraction or addition should be conducted in the compensation circuit 80, becomes constant, thereby enabling simplification of the configuration of the compensation circuit 80.

When variably controlling a pattern, which becomes a comparison target of the output signals Q1 to Q3 as shown in FIG. 3(A), the phase-delay value PDL may be changed according to the pattern. In this case, for example, the digital filter circuit 60 may output the information for determining the phase-delay value PDL to the compensation circuit 80.

EXAMPLE OF A VOLTAGE GENERATION CIRCUIT

Figure 8A:
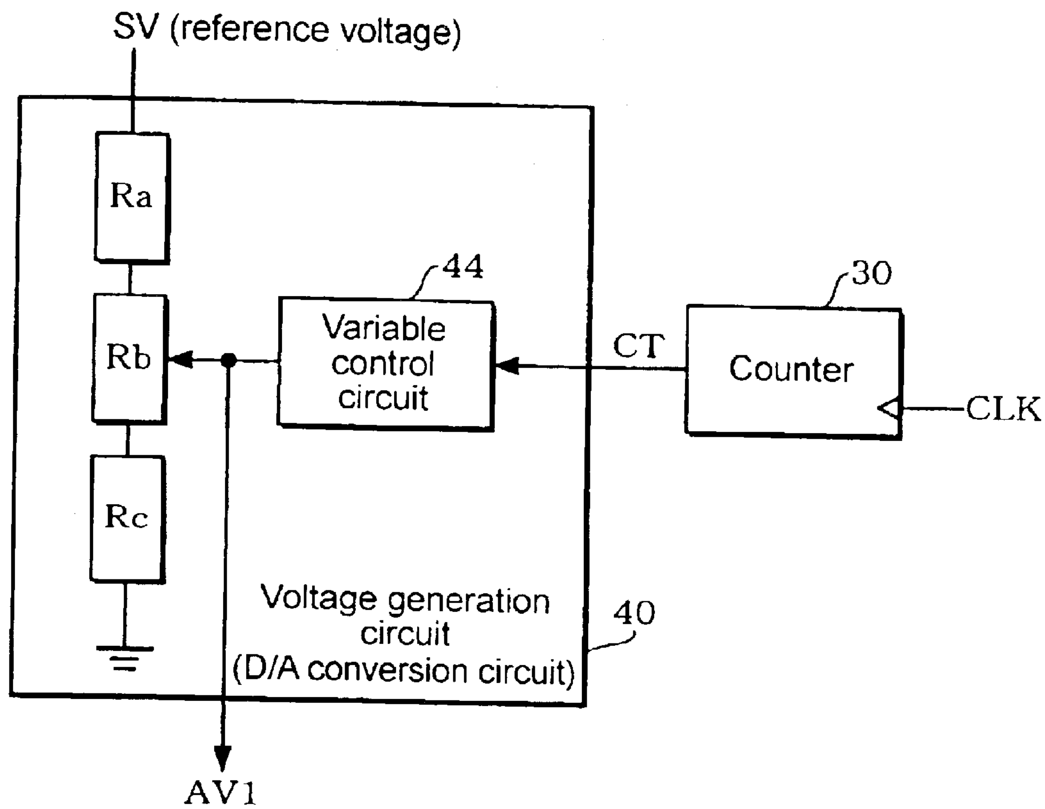
FIGS. 8(A) and (B) are examples of a configuration of a voltage generation circuit.

FIG. 8(A) shows an example of a configuration of the voltage generation circuit 40 (D/A-conversion circuit 42). In FIG. 8(A), the analog voltage AV1 is generated by voltage-dividing a reference voltage SV based on the count value from the counter CT. More specifically, the analog voltage AV1 (a second division voltage) becomes a voltage taken out from a division point of a resistor group Rb among resistor groups Ra, Rb, and Rc coupled in series between a reference-voltage signal line and a grounding line (power supply line). The division point to be selected in the resistor group Rb is conducted by a variable control circuit 44. The variable control circuit 44 is controlled by the count value CT from the counter 30. A temperature gradient (a rate of change of voltage to temperature) characteristic of the reference voltage SV is different from the analog voltage AV2.

It is preferable that the resistor ratio of the resistor groups Ra, Rb, and Rc is determined considering the temperature gradient characteristics (temperature dependency) of the reference voltage and the temperature gradient characteristics of the analog voltage.

Figure 8B:
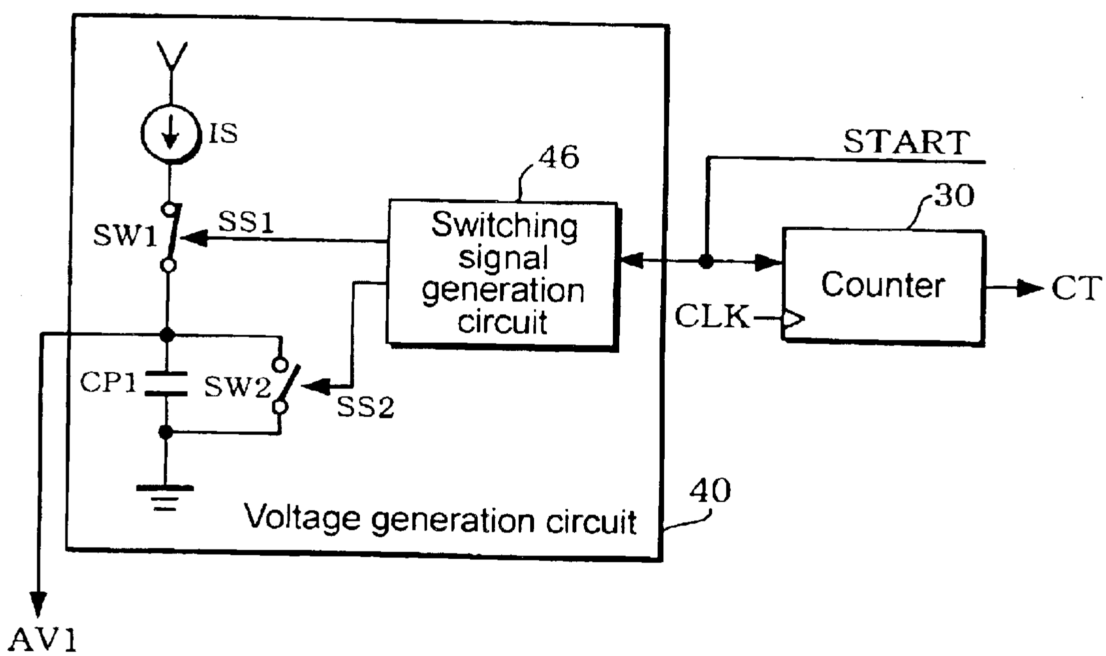

In FIG. 8(B), the voltage generation circuit 40 includes a constant current source IS coupled in series, a switching element SW1, and a capacitor CP1. Moreover, a switching element SW2 coupled in parallel to the capacitor CP1 is included. Then, the switching elements SW1 and SW2 are on/off controlled based on switching signals SS1 and SS2 from a switching signal generation circuit 46.

For example, when a signal START becomes active, the counting operation of the counter 30 starts and the count value CT is incremented (or decremented). When the signal START becomes active, the switching signal generation circuit 46 activates the signal SS1. Accordingly, the switching element SW1 is turned on, and current from the constant current source IS charges the capacitor CP1. Consequently, the monotonically increasing analog voltage AV1 is generated. When the START signal becomes inactive, the signal SS1 becomes inactive, while the signal SS2 become active. Accordingly, the switching element SW1 is turned off, while the switching element SW2 is turned on. Consequently, the capacitor CP1 is discharged. A case of generating a monotonically decreasing AV1 can also be realized with the same configuration as in FIG. 8(B).

Integrated Circuit

Next, an example of application to a temperature-sensor circuit of the A/D-conversion circuit according to an embodiment of the present invention will be described. FIG. 9(A) shows an example of a configuration of an integrated circuit 10, which includes a temperature-sensor circuit 100 that includes an A/D-conversion circuit 150.

The integrated circuit 10 includes the temperature-sensor circuit 100, an electronic volume 200, and a power supply circuit 300. The integrated circuit 10 outputs a digital value (or an analog voltage), which is the sensor output of the temperature-sensor circuit 100, via an output terminal (first terminal in the broader sense). A set value is set to the electronic volume 200 in the integrated circuit 10 via an input terminal (a second terminal in the broader sense).

The temperature-sensor circuit 100 outputs an A/D converted digital value of an analog voltage corresponding to environmental temperature. The A/D conversion is conducted by the A/D-conversion circuit 150. The electronic volume 200 adjusts the voltage value, which the power supply circuit 300 generates, according to the set value set up via the input terminal.

A central processing unit (Central Processing Unit: hereinafter, abbreviated as CPU) 20, which is provided outside the integrated circuit 10, takes in the output (DOUT) from the temperature-sensor circuit 100, and then conducts temperature-compensation control of the power supply circuit 300 by setting a set value to the electronic volume 200.

By outputting the sensor output (DOUT) from the temperature-sensor circuit 100 outside, and adjusting the electronic volume 200 based on the set value determined by the CPU20 and the like, a highly accurate temperature-compensation control can be conducted by flexibly responding to the temperature dependency (the same meaning as temperature gradient characteristics and used in other descriptions of the specification) of the target to be controlled.

For example, according to the embodiment, the output of the temperature-sensor circuit 100 is made without being dependent on manufacturing processes. That is, the output from the temperature-sensor circuit 100 becomes an absolute value independent of manufacturing processes. By using the output of such a temperature sensor circuit 100, a user can associate the output from the temperature-sensor circuit 100 to an environmental temperature. Therefore, more highly precise temperature compensation can be conducted as compared with the case where the temperature dependency is determined by a relative change.

Temperature-Sensor Circuit

Figure 10:
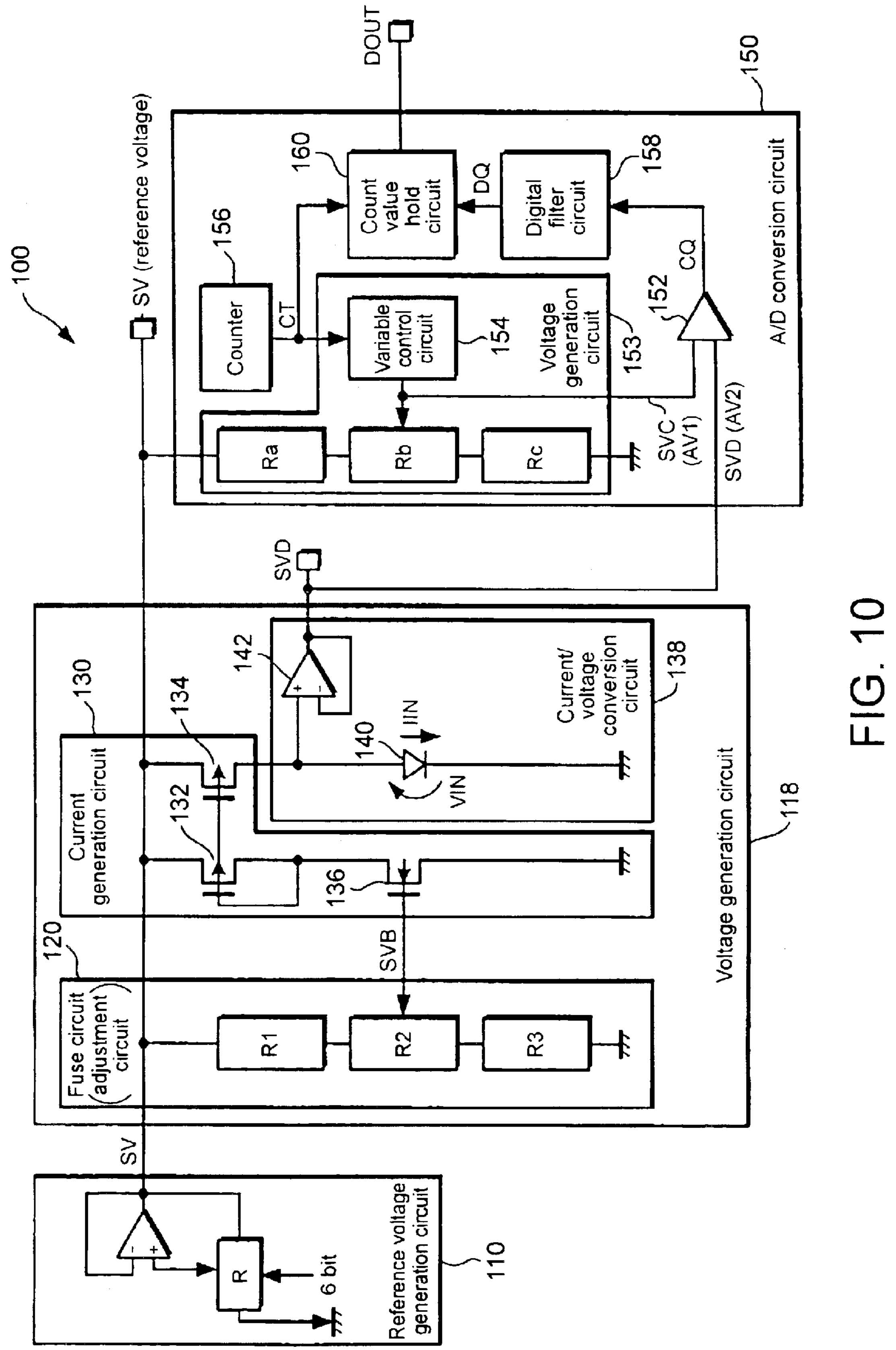
FIG. 10 is an example of a configuration of a temperature-sensor circuit.

FIG. 10 shows an example of a configuration of the temperature-sensor circuit 100. The temperature-sensor circuit 100 includes a reference-voltage generation circuit 110, a voltage generation circuit 118 (a second voltage generation circuit), and the A/D-conversion circuit 150. In addition, configurations omitting a part of the components in FIG. 10 may be employed.

The reference-voltage generation circuit 110 is a circuit, which generates an adjustable reference voltage SV. More specifically, the reference voltage SV having characteristics of a first temperature gradient is generated, and the generated SV is supplied to the voltage generation circuit 118 and a voltage generation circuit 153.

The voltage generation circuit 118 (the second voltage generation circuit) generates the analog voltage SVD (a second analog voltage) having a second temperature gradient characteristics (for example, gradient with a larger gradient than the first temperature gradient). The voltage generation circuit 118 includes a fuse circuit 120 (an adjustment circuit in the broader sense), a current generation circuit 130, and a current/voltage conversion circuit 138.

The fuse circuit 120 generates a voltage SVB (a first division voltage), which is a voltage-divided reference voltage SV from the reference-voltage generation circuit 110. More specifically, the fuse circuit 120 includes resistor groups R1, R2, and R3 coupled in series between a reference-voltage signal line, to which the reference voltage is supplied, and the grounding line. Then, a division ratio of the resistor group R2 can be adjusted by choosing blowable fuse elements coupled to the resistor group R2. Then, the division voltage SVB is generated at the division point of the resistor group R2.

Figure 11:
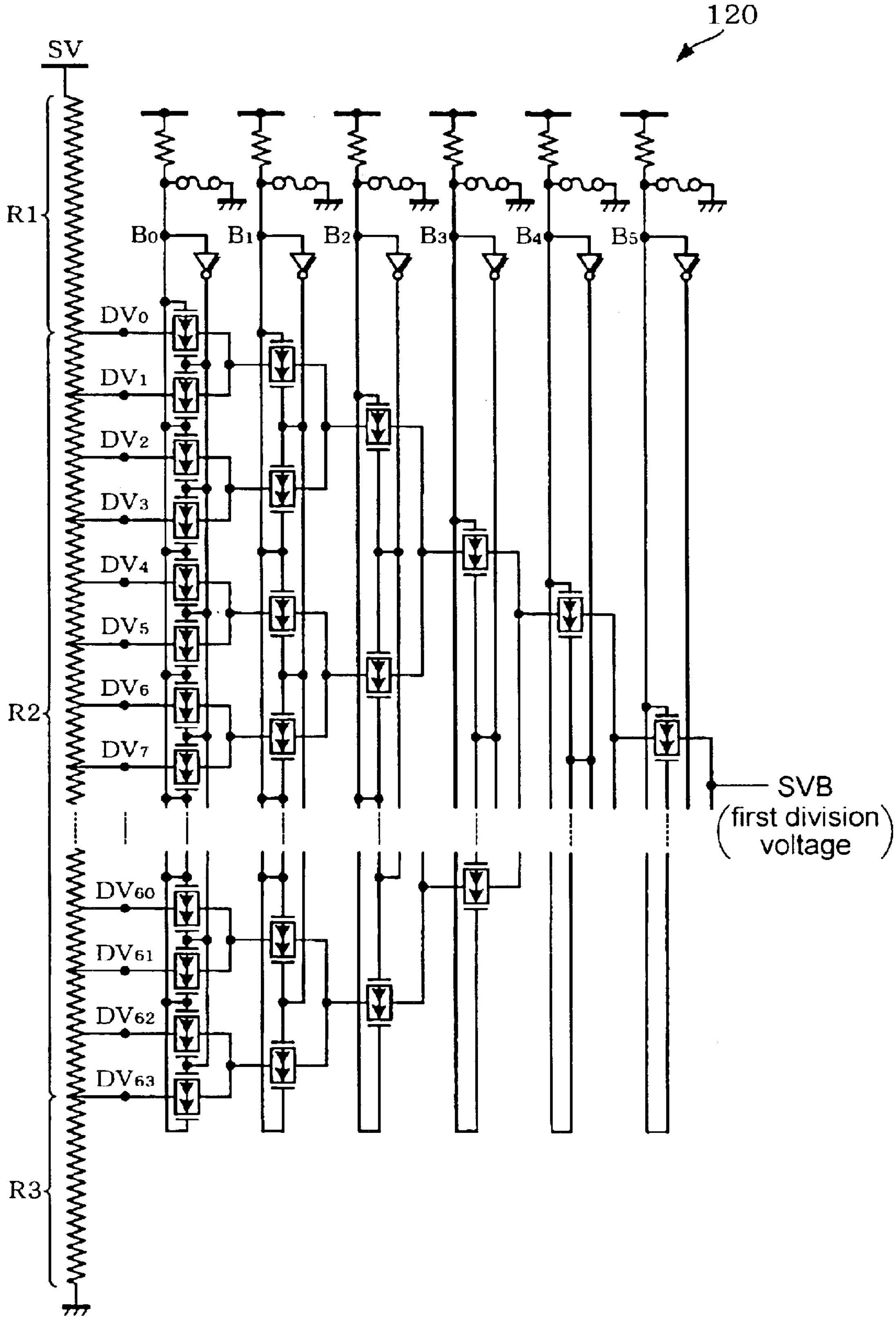
FIG. 11 is an example of a configuration of a fuse circuit.

FIG. 11 shows an example of a configuration of the fuse circuit in detail. The fuse circuit 120 outputs the division voltage SVB from any of 64 division points designated with six bits of B0 to B5. Therefore, the fuse circuit 120 includes a selector group, into which signal lines coupled to the 64 division points of DV0 to DV63 are inputted. Each selector circuit, which comprises the selector group, is a two-input and one-output selection circuit. The selector group selects 32 division points from the 64 division points in the first stage, selects 16 division points from the 32 division points in the second stage, and finally outputs a voltage of one division point selected in the sixth stage as the division voltage SVB. In each stage, each bit of the six-bits is provided as a selection-control signal.

A bit signal line, by which each bit state is being held, is pulled up via a resistor circuit of high resistance and also grounded via a fuse element. Therefore, the state of the bit signal line, where the fuse element is not blown, is set as "0", and the state of a bit signal line where the fuse element is blown is set as "1". Accordingly, by selecting whether the fuse element coupled to each bit signal line is to be blown or not, arbitrary division points of the resistor group R2 can be selected.

For example, in a case that the resistor ratio of the resistor groups R1, R2, and R3 is set as "2:2:7", the fuse circuit 120 can output 64 kinds of voltages, which is between "4:7" voltage and in "2:9" voltage made by dividing the reference voltage, as the division voltages SVB.

In FIG. 11, although the fuse circuit 120 is described as the reference voltage being divided by the resistor groups R1, R2, and R3, this does not limit the configuration thereof. For example, the fuse circuit 120 may also be constituted such that the reference-voltage SV itself is made to be outputted as the division voltage SVB.

By going back to FIG. 10, the description will be continued. The division voltage SVB outputted from the fuse circuit 120 is inputted to the current generation circuit 130.

The current generation circuit 130 has a transistor 136 with a gate terminal from which the division voltage SVB is supplied, and generates a current according to the gate voltage of the transistor 136. More specifically, the current generation circuit 130 includes p type transistors (a first conductivity type transistor in the broader sense) 132 and 134, of which source terminals are coupled to the reference-voltage signal line, and an n type transistor 136 (a second conductivity type transistor in the broader sense) having a source terminal that is grounded. The gate terminal and drain terminal of the p type transistor 132 are coupled mutually. The gate terminals of the p type transistors 132 and 134 are coupled mutually. The drain terminal of the p type transistor 132 is coupled to the drain terminal of the n type transistor 136. The drain terminal of the p type transistor 134 is coupled to a current/voltage conversion circuit 138 (a diode element 140).

As for the current generation circuit 130 of such a configuration, the drain current of the n type transistor 136 is controlled according to the gate voltage of the n type transistor 136, to which the division voltage SVB having been adjusted in the fuse circuit 120 is supplied. Because the p type transistors 132 and 134 constitute a current mirror structure, if W/L (channel width/channel length) of the p type transistors 132 and 134 is set as, for example, "1:2", the drain current IIN of the p type transistor 134 becomes twice as large as the drain current ID of the n type transistor 132.

A current/voltage conversion circuit 138 has the diode element 140 (current/voltage conversion element), to which a current from the current generation circuit 130 is supplied, and outputs an analog voltage generated at both terminals of the diode element 140 as the SVD (a second analog voltage). More specifically, the anode of the diode element 140 is coupled to the drain terminal of the p type transistor 134. The cathode of the diode element is grounded. Therefore, a voltage is generated at the terminals of the diode element according to the drain current IIN, which flows in the diode element 140, and is outputted as an analog voltage. In FIG. 10, the analog voltage SVD (AV2) is outputted from an analog voltage output terminal via an operational amplifier 142 coupled as a voltage-follower to increase drive capability.

The A/D-conversion circuit 150 is the one described in FIG. 1, 2 and others and includes a comparator 152, a digital filter circuit 158, a count value hold circuit 160, a voltage generation circuit 153 (a first voltage generation circuit), and a counter 156. Because these circuits were already described in detail, the description thereof will be omitted here.

Figure 12:
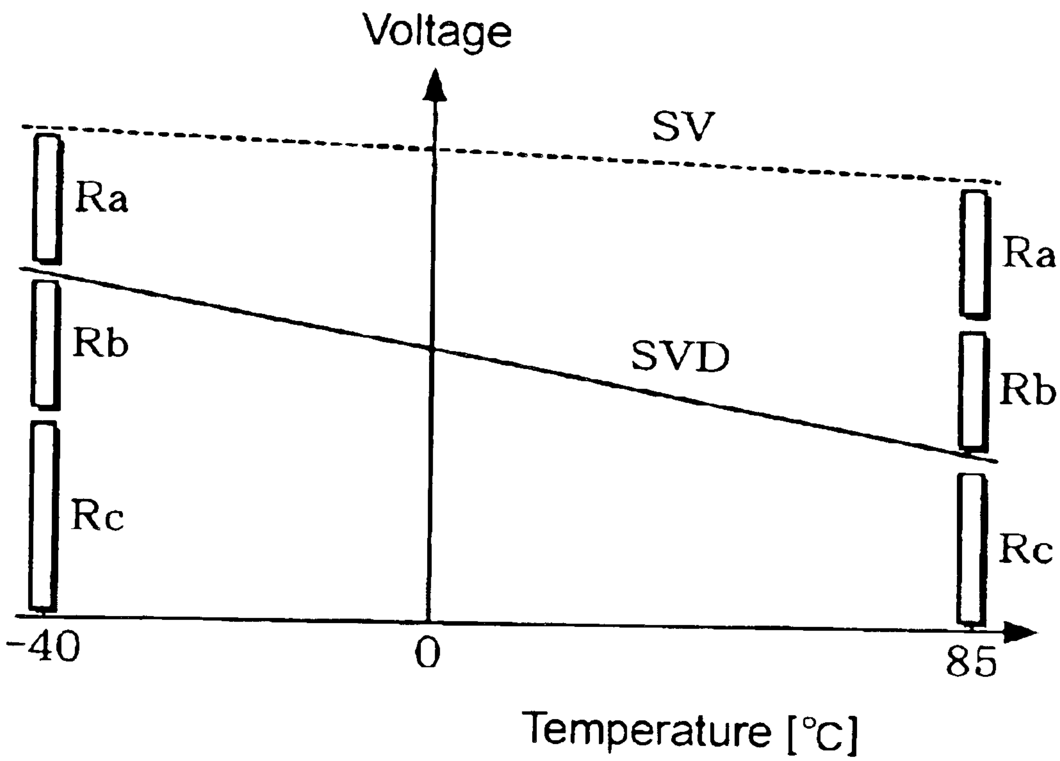
FIG. 12 is an example of temperature gradient characteristics of a reference voltage and an analog voltage.

Temperature dependency (temperature gradient characteristics) of the reference voltage SV and the analog voltage SVD (the second analog voltage AV2) is schematically shown in FIG. 12.

Environmental temperature from −40 C.° to 85 C.° is shown on the horizontal axis, and variations of the reference voltage SV and the analog voltage SVD (AV2) are shown on the vertical axis. The reference voltage SV and the analog voltage SVD decrease, as the environmental temperature increases, wherein gradient (temperature gradient), which indicates the temperature dependency of SV and SVD, are different. That is, the reference voltage SVD has a first temperature gradient that is a small gradient (more flat temperature gradient), and a voltage SVC (AV1), which is a voltage-divided SVD, also has substantially the same temperature gradient. On the other hand, the analog voltage SVD (AV2) has a second temperature gradient that is a large gradient. That is, the analog voltage SVD (AV2) has a larger temperature gradient than SV, and the temperature dependency thereof is large.

Figure 13:
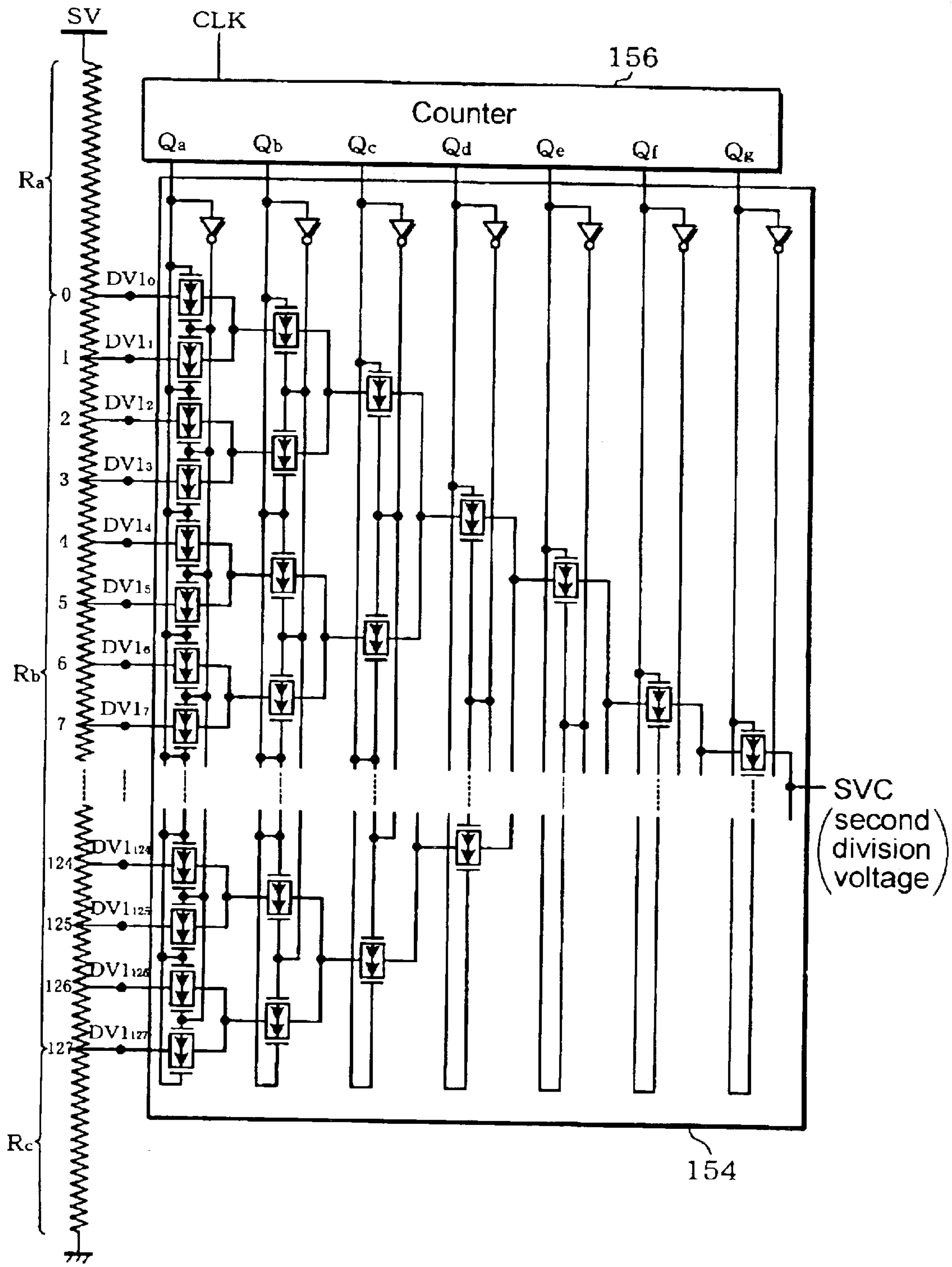
FIG. 13 is an example of a configuration of a variable control circuit.

Next, a variable control circuit 154, which takes out the division voltage SVC (AV1) from division points of such a resistor group Rb, will be described in detail. FIG. 13 shows an example of a configuration of the variable control circuit 154, which takes out the division voltage SVC from the division points of the resistor group Rb by using the count value of a counter 156.

The variable control circuit 154 outputs any voltage of the 128 division points designated with seven bits as the division voltage SVC based on the count value CT from a seven-bit counter 156, which conducts increment or decrement processing, synchronizing with the clock CLK. Such a variable control circuit 154 has the same configuration as the selector group of the fuse circuit 120 described in FIG. 11. Therefore, the outputs Qa to Qg of the counter 156 change at every increment or decrement, and thus division points to be selected change according to the value of the outputs Qa to Qg.

Figure 14:
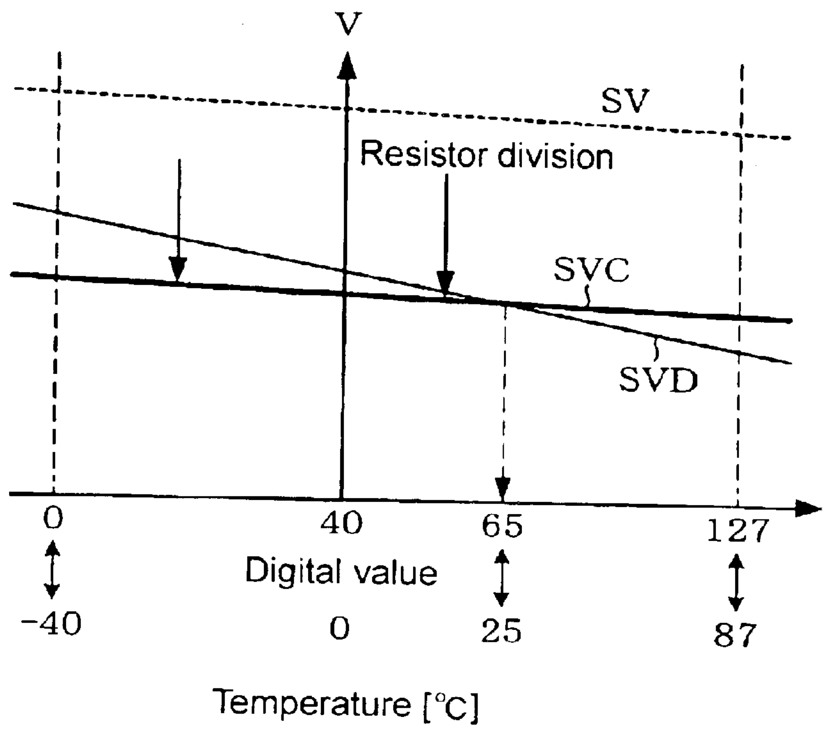
FIG. 14 is an example of temperature gradient characteristics of a division voltage SVC.

For example, if the count value CT is "0", the voltage of a division point DV10 is outputted as the division voltage SVC. Then, every time the count value CT is incremented, each voltage of division points DV11, DV12 to DV1127 is sequentially outputted as the division voltage SVC. At this time, the division voltage SVC is a divided reference voltage SV by resistor-division, and as shown in FIG. 14, has substantially the same temperature gradient as the temperature gradient of the reference voltage SV.

Because the division voltage SVC becomes lower as the count value CT is increased, there exists an intersection, where the temperature characteristics of the analog voltage SVD and the temperature characteristics of the division voltage SVC intersect. The comparator 152 shown in FIG. 10 detects the intersection for the environmental temperature.

That is, in FIG. 10, the comparator 152 outputs a pulse-shaped signal CQ to the digital filter circuit 158, when the SVC (AV1) and the SVD (AV2) match with each other (when an intersection of the temperature characteristics of the SVC and the temperature characteristics of the SVD is detected). Then, the digital filter circuit 158 conducts digital filtering processing to the signal CQ, and then outputs the processed signal DQ to the count value hold circuit 160 (register). In this case, noise as shown in B1 and B2 of FIG. 5 (B) is generated in the signal SVC (AV1) and the signal CQ, due to the switching operation of the selector group as described in FIG. 13. However, the noise is removed by the digital filter circuit 158.

Then, the count value hold circuit 160 holds the count value CT upon receipt of the pulse-shaped signal DQ from the digital filter circuit 158. More specifically, the output signal CQ of the comparator 152 changes, when the count value CT is incremented synchronizing with the clock CLK and thereby the analog voltage SVD and the division voltage SVC become equal. Then, the count value hold circuit 160 holds (latches) the count value CT from the counter 156 by the pulse-shaped signal DQ outputted from the digital filter circuit 158. Then, the count value held at the count value hold circuit 160 is read out by the CPU 20 as the digital value DOUT via the output terminal (the first terminal or data terminal) of the integrated circuit 10 in FIG. 9.

Because seven bits can represent 128 states, when each state is assigned to each environmental temperature, each state of environmental temperature from −40 C.° to 87 C.° can be determined by the count value. Therefore, the surrounding environmental temperature of the integrated circuit 10 (the temperature-sensor circuit 100) can be associated with the count value CT (the digital value DOUT).

In FIG. 10, although the reference voltage SV is generated in the reference voltage generation circuit 110, the configuration thereof is not limited to this. The reference-voltage generation circuit 110 can generate a preferred reference voltage by arbitrarily changing the resistor division ratio of the resistor R of 64 states designated with six bits. The reference-voltage generation circuit 110 can be made such that arbitrary resistor ratios may be set up according to the six-bit data, which has been set in a given setting register by using the selector group of the fuse circuit 120 shown in FIG. 11. It is preferable that the reference voltage SV is lower than the voltage of a system power supply provided from the outside to adjust the voltage by a regulator and the like without using a booster circuit. Moreover, it is preferable that the reference voltage SV is a voltage determined considering the adjustment error range of the regulator and the like rather than the voltage of the system power supply. For example, when the system power supply is a 3V power supply, it is preferable that the reference voltage SV is lower than 2.7V, which corresponds to an allowable error of −10% of the 3V power supply. Furthermore, if the adjustment-error range is, for example, 0.2V, it is preferable that the reference voltage SV is, for example, 2.2V, which is less than 2.5V.

Method of Adjusting a Temperature-Sensor Circuit

Figure 15:
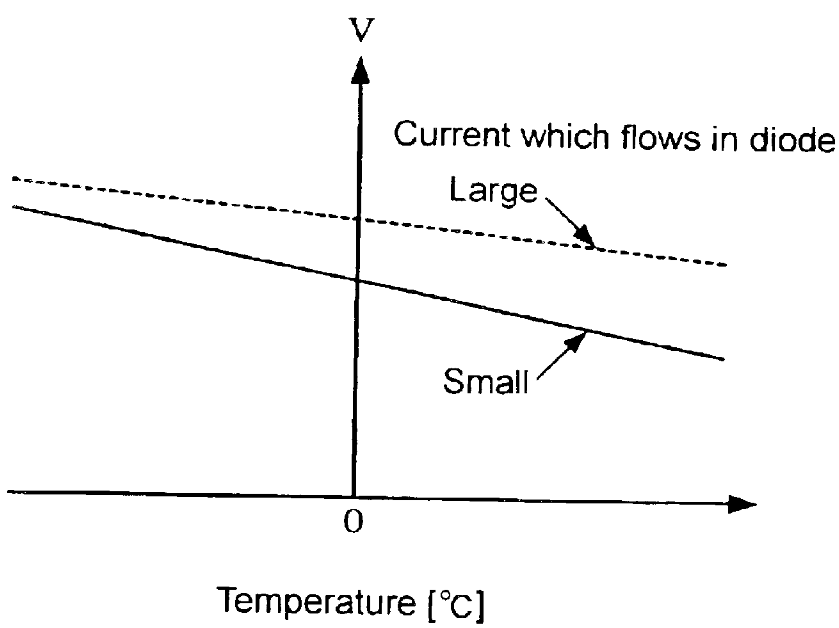
FIG. 15 is an example of characteristic of a diode element.

Next, a method of adjusting the temperature-sensor circuit 100 will be described. Generally, as shown in FIG. 15, regarding the current which flows in the diode element 140 of FIG. 10, the temperature characteristics for the voltage-change generated at both terminals varies depending on whether the current is large or small. Therefore, it is preferable to stabilize the current, which flows in the diode element 140.

Figure 16:
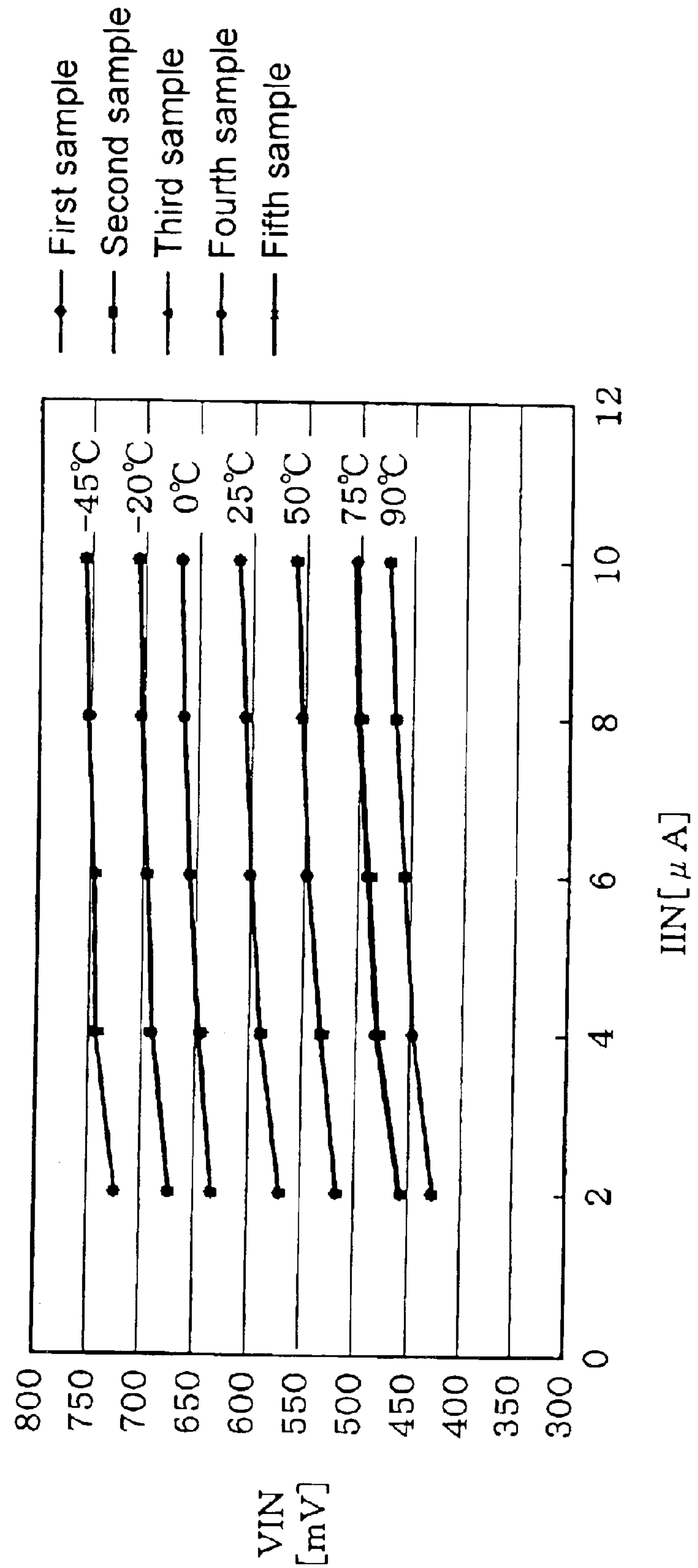
FIG. 16 is an example of current/voltage conversion characteristics of diode elements with different process conditions at each environmental temperature.
Figure 17:
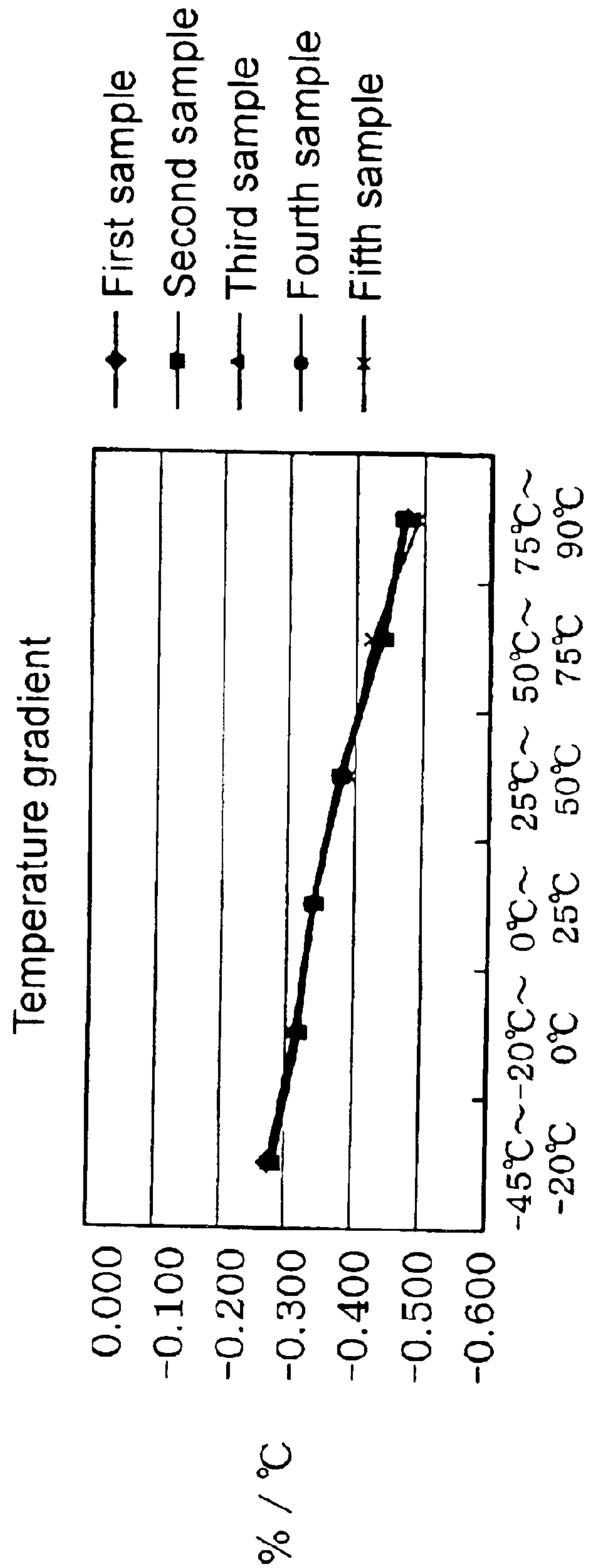
FIG. 17 is an example of temperature gradient characteristics of a diode element with different process conditions.

For example, in FIG. 16, the current to voltage transfer characteristic of five kinds of diode elements of different process conditions for each environmental temperature is shown. FIG. 17 shows a temperature gradient in the case that current IIN, which flows in the diode element, is 6 $\mu$A. As described above, it is understood that the voltage generated at both terminals of a diode element does not depend on manufacturing processes, when the current IIN is constant and the temperature is constant. It is also understood that when the current IIN is constant, the temperature gradient, which indicates temperature dependency, does not depend on manufacturing processes.

Therefore, when the current which flows in the diode element is constant, the voltage at both terminals of the diode element does not dependent on manufacturing processes and is constant. Therefore, the current, which flows in the diode element, may be adjusted according to the manufacturing process such that the analog voltage SVD (AV2) is outputted corresponding to an environmental temperature. More specifically, by selecting the division points of the fuse circuit 120 and adjusting the division voltage SVB, which is to be outputted, such that the analog voltage SVD becomes a target voltage, the current of the diode element for obtaining the analog voltage SVD corresponding to the environmental temperature at the time of adjustment can be trimmed. Thereby, a user can determine the taken-in environmental temperature at the taken-in time by using the digital value DOUT and the analog voltage SVD that are taken out from the output terminal.

Figure 18:
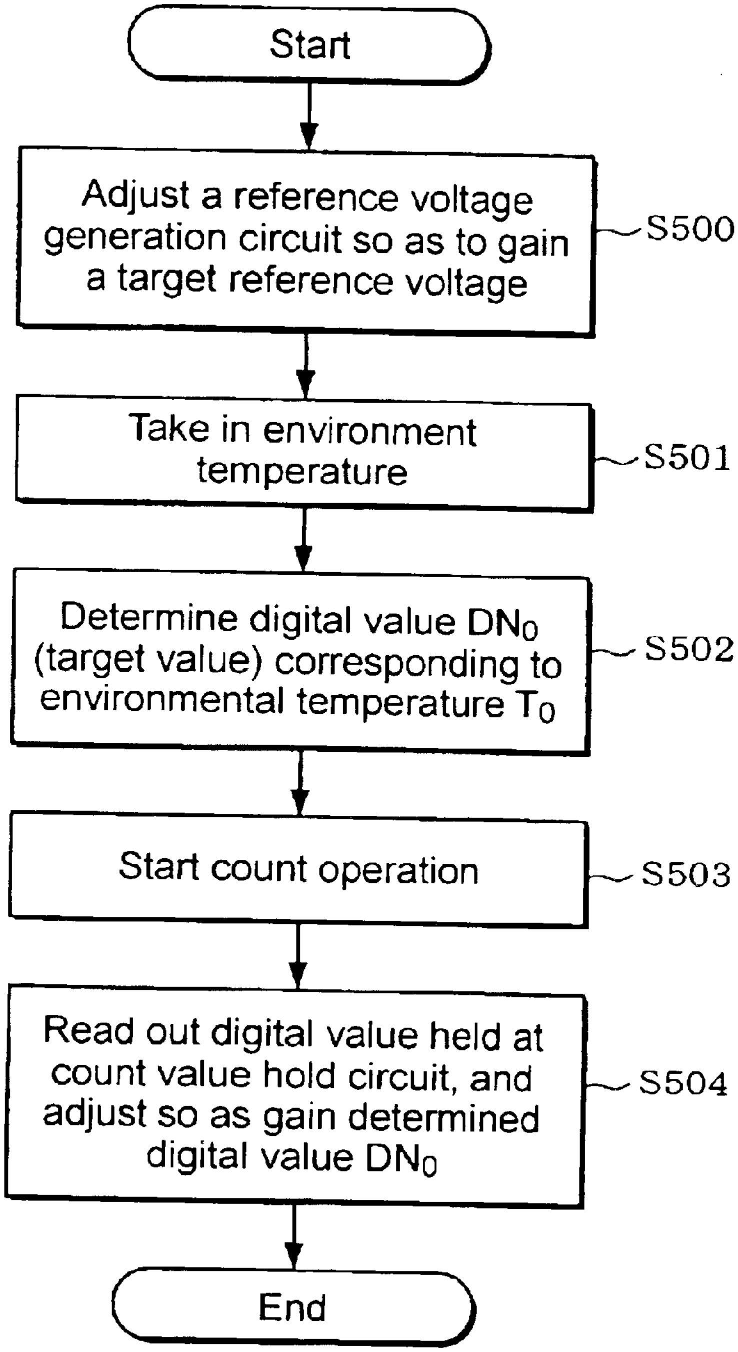
FIG. 18 is a flow chart describing a method of adjusting a temperature-sensor circuit.

FIG. 18 shows a flow chart describing a method of adjusting a temperature-sensor circuit, which uses the digital value DOUT.

First, the reference-voltage generation circuit 110 is adjusted so as to become a target reference voltage (Step S500). Next, environmental temperature is taken in around the measurement environment (Step S501), and a digital value is determined, which has been registered in advance (a target value, in the broader sense), corresponding to the taken-in environmental temperature (Step S502). This can be realized when a CPU and the like read out a digital value DN0 (a count value) corresponding to the taken-in environmental temperature T0 by referring to a look-up table shown in FIG. 19.

Then, the operation of the counter 156 (Step S503) is started, and the digital value DOUT (a count value) is read out, which has been held at the count value hold circuit 160 by a change of the output of the comparator 152. Then, the division voltage SVB (a first division voltage) outputted from the fuse circuit 120 is adjusted so as to become a digital value determined at Step S502 (Step S504).

According to the above-described embodiment, adjustment of the temperature-sensor circuit 100 is realized by determining a target value corresponding to an environmental temperature (a surrounding temperature) and adjusting the division voltage SVB such that the digital value DOUT from the A/D-conversion circuit 150 matches with the target value. By adjusting the temperature sensor circuit 100 in this way, the digital value independent of manufacturing processes of the integrated circuit 10 can be obtained.

Adjustment of Electronic Volume

Figure 9:
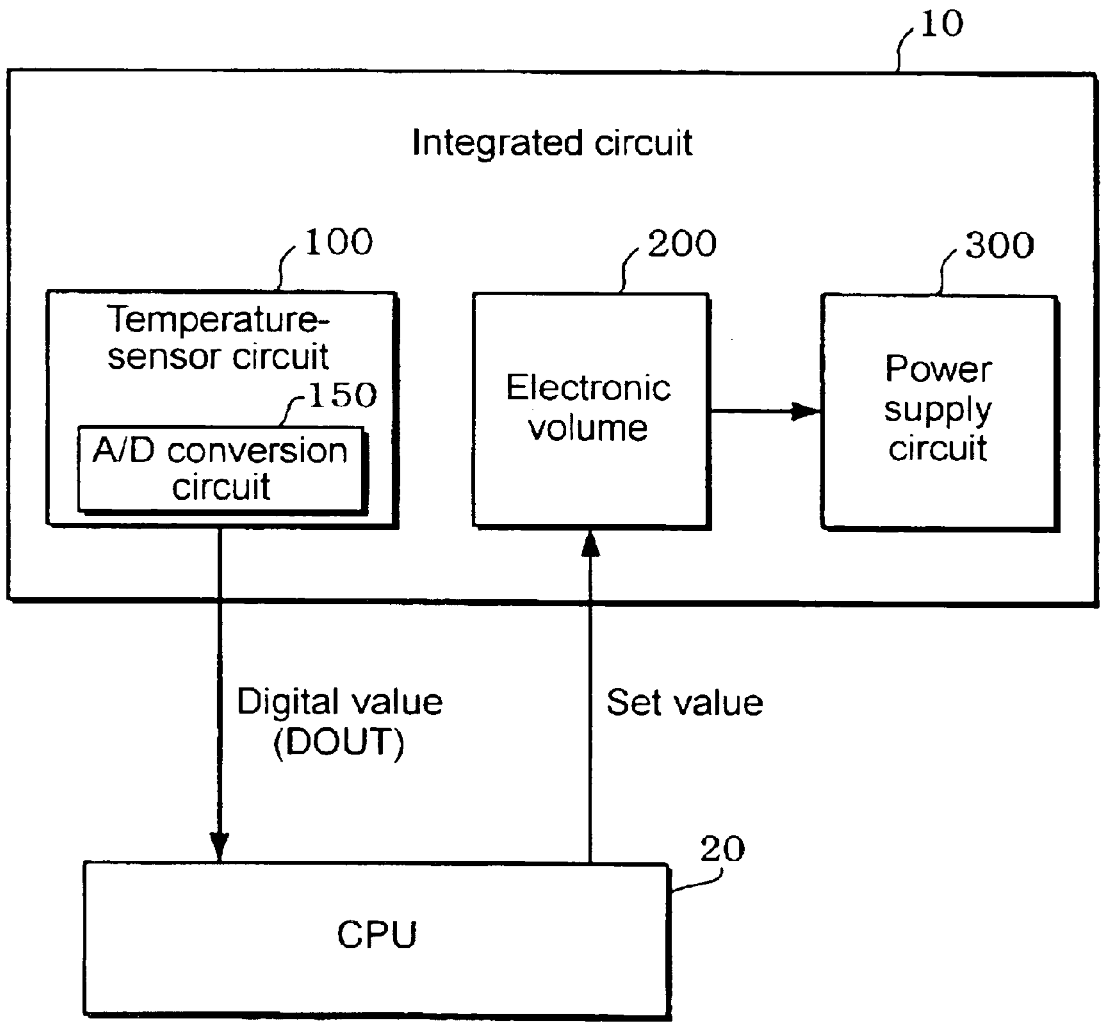
FIG. 9 is an example of a configuration of an integrated circuit containing a temperature-sensor circuit.
Figures 19, 20:
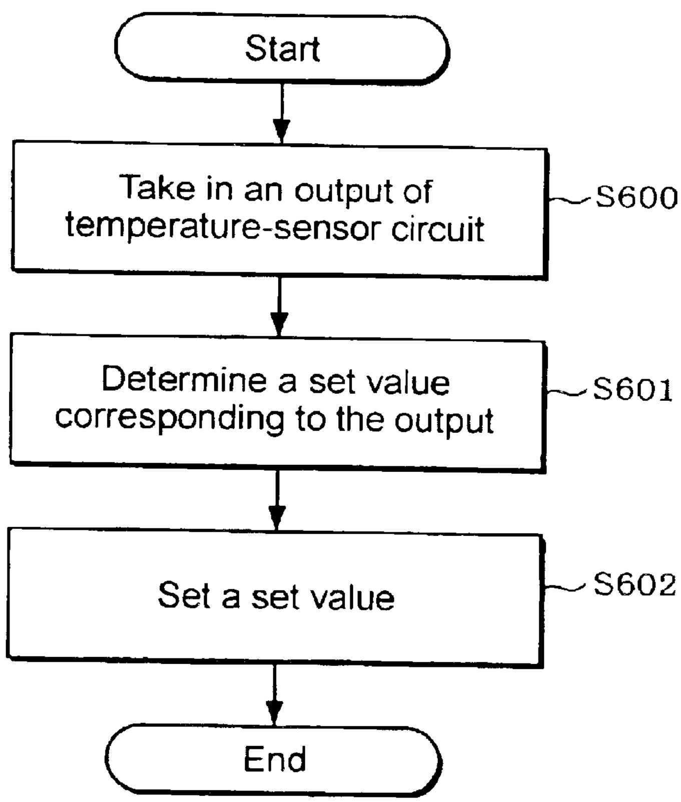
FIG. 19 is an example of a look-up table of environmental temperature and digital value.
FIG. 20 is a flow chart describing a method of adjusting an electronic volume.

FIG. 20 shows a flow chart describing a method of adjusting an electronic volume of the integrated circuit shown in FIG. 9. First, the CPU 20 takes in the digital value DOUT, which is to be outputted from the temperature-sensor circuit 100 (Step S600). Then, the CPU20 determines a set value corresponding to the taken-in digital value DOUT (Step S601). This can be realized when the CPU 20 determines the environmental temperature T1 at the time when the taken-in conducted at Step S600 using the taken-in digital value DOUT at Step S600. That is, the CPU 20 just determines a set value, which has been registered in advance, corresponding to the environmental temperature T1 by referring to the setting table.

Next, the CPU 20 sets up the electronic volume 200 in the integrated circuit 10 by using the set value, which has been determined at Step S601 (Step S602).

In order to explain the effects of the embodiment, a method of adjusting the electronic volume of a comparison example will be described. In the comparison example, because the temperature-sensor circuit only can output a sensor output that is dependent on the manufacturing process, the temperature compensation is conducted by the following method.

Figure 21:
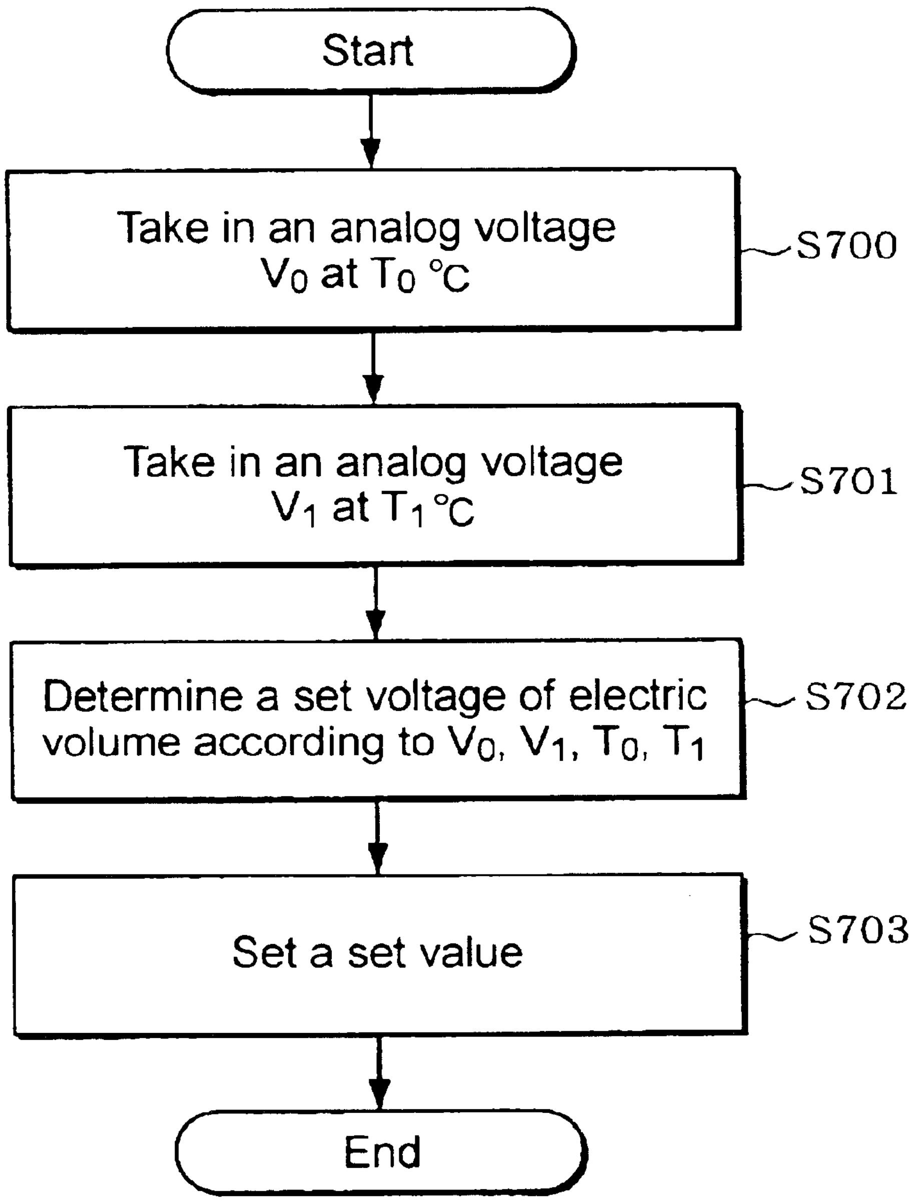
FIG. 21 is a flow chart describing a method of adjusting an electronic volume in a comparison example.

FIG. 21 shows a flow chart describing the method of adjusting an electronic volume of the integrated circuit in the comparison example. As for the comparison example, first, a CPU obtains an analog voltage V0 at an environmental temperature T0 C° (Step S700). Then, the CPU obtains an analog voltage V1 at an environmental temperature T1 C° (Step S701).

Then, the CPU estimates an environmental temperature as T1, at the time when the voltage is changed from the obtained analog voltage V0 of environmental temperature T0 to the analog voltage V1, and determines a set value to the electronic volume corresponding to the environmental temperature T1 (Step S702). Next, the CPU sets the electronic volume of the integrated circuit by using the set value, which has been determined at Step S702 (Step S703).

As for the comparison example, the temperature dependency is determined by a relative change. Therefore, a value to be set to the electronic volume varies due to manufacturing process variation, accuracy of the obtained analog voltage, and error of the evaluation algorithm when conducting the relative evaluation, thereby a highly precise temperature compensation is difficult to conduct.

On the other hand, according to the embodiment, the output from the temperature-sensor circuit 100 is an absolute value being independent of the manufacturing process. Therefore, an environmental temperature can be determined from the absolute value, and the CPU 20 just needs to determine a set value corresponding to the environmental temperature. Therefore, the control is simplified and highly precise temperature compensation can be realized.

The present invention is not limited to the above-described embodiments, and various modifications can be made within the scope of the present invention.

For example, configurations of an A/D-conversion circuit, a digital filter circuit, a temperature-sensor circuit, and an integrated circuit are not limited to the ones that have been described in the embodiments of the present invention, but various modifications can be made. For example, regarding the number of stages of the hold circuit included in the digital filter circuit, and configurations of a pattern matching detection, various modifications can be made. Although in the embodiment, a case using a fuse circuit as an adjustment circuit has been described, the configuration is not limited to this. The adjustment circuit may be a circuit which generates adjustable voltages.

In the specification or the drawings, the terms of (FF1 to FF3, flip-flop, EXOR1 to EXOR3, PQ to PQ3, CPU, output terminal, input terminal, fuse circuit, p type transistor, n type transistor, digital value, and etc.), which are quoted as the broader sense of (first to Nth hold circuits, hold circuit, first to Nth exclusive OR gates, first to Nth pattern signals, processor, first terminal, second terminal, adjustment circuit, first conductivity type transistor, second conductivity type transistor, target value) can be replaced with the terms in the broader sense in other descriptions in the specification or the drawings.

As for the inventions according dependent claims in the present invention, configurations omitting a part of the configuration requirements of the dependent claims can be employed. Any essential part of the present invention concerning the independent claims can also be made dependent on other independent claims.

What is claimed is:

1. An A/D-conversion circuit that converts an analog voltage to a digital value to be outputted, comprising:

a counter that outputs a count value;

a first voltage generation circuit that generates a first analog voltage, which monotonically increases or decreases;

a comparator that compares the first analog voltage from the first voltage generation circuit with a second analog voltage, to which A/D conversion is applied, and outputs an output signal according to a comparison result;

a digital filter circuit that receives the output signal from the comparator, executes digital filtering for the output signal from the comparator, and outputs an output signal, for which the digital filtering has been executed; and a count value hold circuit that receives the output signal from the digital filter circuit and the count value from the counter, and that holds the count value from the counter based on the output signal from the digital filter circuit, and outputs a held count value as the digital value.

2. The A/D-conversion circuit according to claim 1, wherein the digital filter circuit includes first to Nth (N is an integer of 2 or more) hold circuits, wherein the output signal from the comparator is held at the first held circuit and the hold signal is sequentially transferred by shifting to the hold circuit of the subsequent stage, and changes the voltage level of the output signal of the digital filter circuit when a pattern of output signals of the first to Nth hold circuit matches with a predetermined pattern.

3. The A/D-conversion circuit according to claim 2, wherein the digital filter circuit changes the voltage level of the output signal of the digital filter circuit after the voltage level of the output signal of the first hold circuit has changed.

4. The A/D-conversion circuit according to claim 1, further comprising a compensation circuit, which subtracts or adds compensation of a phase-delay value in the digital filter circuit from or to the count value held at the count value hold circuit.

5. The A/D-conversion circuit according to claim 1, wherein the first voltage generation circuit is a D/A-conversion circuit that generates the first analog voltage by converting the count value from the counter into an analog voltage.

6. The A/D-conversion circuit according to claim 5, wherein the D/A-conversion circuit generates the first analog voltage by voltage-dividing of a reference voltage, which has a temperature gradient characteristic different from the second analog voltage, based on the count value from the counter.

7. A temperature-sensor circuit, comprising:

the A/D-conversion circuit according to claim 1;

a reference-voltage generation circuit that generates a reference voltage having a first temperature gradient characteristic, and supplies the generated reference voltage to the first voltage generation circuit as a reference voltage for generating the first analog voltage; and a second voltage generation circuit that generates the second analog voltage having a second temperature gradient characteristic.

8. The temperature-sensor circuit according to claim 7, wherein the second voltage generation circuit comprises:

an adjustment circuit that generates a first divided voltage obtained by dividing a reference voltage from the reference-voltage generation circuit;

a current generation circuit that has a transistor having a gate terminal from which the first division voltage is supplied, and generates a current according to the gate voltage of the transistor; and a current/voltage conversion circuit that has a diode element, to which current from the current generation circuit is supplied, and outputs an analog voltage generated at both terminals of the diode element as the second analog voltage.

9. An integrated circuit, comprising:

the temperature-sensor circuit according to claim 7;

a power supply circuit;

a first terminal that outputs the digital value from the A/D-conversion circuit;

a second terminal, into which a set value determined based on the digital value from the first terminal is inputted; and an electronic volume, which adjusts an output voltage of the power supply circuit based on the set value from the second terminal.

10. A method of adjusting the temperature-sensor circuit according to claim 8, a target value, corresponding to an environmental temperature which is taken in, is determined, and the first division voltage is adjusted such that the digital value from the A/D-conversion circuit matches with the target value.

* * * * *